(12) United States Patent
Kuniyoshi et al.

(10) Patent No.: US 10,879,329 B2
(45) Date of Patent: Dec. 29, 2020

(54) SEMICONDUCTOR DEVICE, SEMICONDUCTOR SUBSTRATE, LUMINESCENT UNIT, AND DISPLAY UNIT

(71) Applicant: JOLED INC., Tokyo (JP)

(72) Inventors: Tokuaki Kuniyoshi, Tokyo (JP); Naoki Asano, Tokyo (JP); Ryo Koshiishi, Tokyo (JP); Hiroshi Fujimura, Tokyo (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 16/273,156

(22) Filed: Feb. 12, 2019

(65) Prior Publication Data
US 2019/0305064 A1    Oct. 3, 2019

(30) Foreign Application Priority Data

Mar. 29, 2018 (JP) .................................. 2018-064404
Aug. 24, 2018 (JP) .................................. 2018-157059

(51) Int. Cl.
*H01L 27/32* (2006.01)
*H01L 29/786* (2006.01)
(Continued)

(52) U.S. Cl.
CPC ...... *H01L 27/3262* (2013.01); *H01L 27/3265* (2013.01); *H01L 27/3276* (2013.01); *H01L 29/7869* (2013.01); *G09G 3/3233* (2013.01); *G09G 2300/0819* (2013.01); *H01L 21/0217* (2013.01); *H01L 21/0273* (2013.01);
(Continued)

(58) Field of Classification Search
CPC ............. H01L 27/0705; H01L 27/0727; H01L 27/0733; H01L 27/1214; H01L 27/1255; H01L 27/124; H01L 29/7869; H01L 27/3241; H01L 27/3265; G09G 3/30–3258; G11C 11/24; G11C 11/40; G11C 11/4023
See application file for complete search history.

(56) References Cited

U.S. PATENT DOCUMENTS

2007/0152217 A1\* 7/2007 Lai ....................... H01L 29/7869
 257/59
2011/0024751 A1\* 2/2011 Yamazaki ........... H01L 27/1248
 257/57
(Continued)

FOREIGN PATENT DOCUMENTS

JP 2015-108731 A 6/2015

*Primary Examiner* — Sonya McCall-Shepard
(74) *Attorney, Agent, or Firm* — Hauptman Ham, LLP

(57) ABSTRACT

A semiconductor device includes a base, a first wiring line, a semiconductor film, a second wiring line, an insulating film, and a semiconductor auxiliary layer. The first wiring line is provided in the first, second, and third regions of the base. The semiconductor film has one or more low-resistance regions, is provided between the first wiring line and the base in the first region, and is in contact with the first wiring line in the second region. The second wiring line is in contact with the first wiring line in the third region. The insulating film is provided between the first wiring line and the semiconductor film in the first region. The semiconductor auxiliary layer is in contact with the semiconductor film at least in the first region, and assists electrical coupling via the first region.

15 Claims, 31 Drawing Sheets

(51) Int. Cl.
*H01L 27/12* (2006.01)
*H01L 27/07* (2006.01)
H01L 29/66 (2006.01)
H01L 21/02 (2006.01)
H01L 21/4763 (2006.01)
H01L 21/027 (2006.01)
*G09G 3/3233* (2016.01)

(52) U.S. Cl.
CPC .. *H01L 21/02164* (2013.01); *H01L 21/02178* (2013.01); *H01L 21/02271* (2013.01); *H01L 21/47635* (2013.01); *H01L 27/124* (2013.01); *H01L 27/1218* (2013.01); *H01L 27/1225* (2013.01); *H01L 27/1255* (2013.01); *H01L 27/1262* (2013.01); *H01L 27/3211* (2013.01); *H01L 29/66969* (2013.01); *H01L 2227/323* (2013.01)

(56) References Cited

U.S. PATENT DOCUMENTS

| | | | |
|---|---|---|---|
| 2011/0042670 A1* | 2/2011 | Sato | H01L 29/78621 257/43 |
| 2013/0069053 A1* | 3/2013 | Yamazaki | H01L 27/1225 257/43 |
| 2015/0162399 A1 | 6/2015 | Sato | |
| 2015/0179724 A1 | 6/2015 | Lee et al. | |
| 2017/0047390 A1* | 2/2017 | Lee | G09G 3/3233 |
| 2018/0151595 A1* | 5/2018 | Saitoh | H01L 27/1225 |

\* cited by examiner

SEMICONDUCTOR DEVICE, SEMICONDUCTOR SUBSTRATE, LUMINESCENT UNIT, AND DISPLAY UNIT

CROSS REFERENCE TO RELATED APPLICATIONS

This application claims the benefit of Japanese Priority Patent Application Nos. 2018-064404 filed on Mar. 29, 2018, and 2018-157059 filed on Aug. 24, 2018, the entire contents of each of which are incorporated herein by reference.

BACKGROUND

The technology relates to a semiconductor device, to a display unit that includes the semiconductor device, to a semiconductor substrate, and to a luminescent unit that includes the semiconductor substrate.

With a recent increase in screen size and driving speed of an active-matrix display, a development in a thin-film transistor that includes an oxide semiconductor film as a channel is becoming more relevant. For example, a semiconductor device for driving the display unit includes such a thin-film transistor and a storage capacitor that are electrically coupled to each other. Reference is made to Japanese Unexamined Patent Application Publication No. 2015-108731, for example.

SUMMARY

It is desirable that contact stability or connection stability between a thin-film transistor and a storage capacitor be enhanced. Additionally, with an improvement in definition, it becomes increasingly difficult to ensure a storage capacitor.

It is desirable to provide a semiconductor device that makes it possible to improve the contact stability between a thin-film transistor and a storage capacitor, and a display unit that includes such a semiconductor device, and to provide a semiconductor substrate that makes it possible to ensure a storage capacitance while improving definition and a luminescent unit that includes such a semiconductor substrate.

According to one embodiment of the technology, there is provided a semiconductor device including: a base having a first region, a second region, and a third region, the first region, the second region, and the third region being provided in this order along a predetermined direction and adjacent to each other; a first wiring line provided in the first region, the second region, and the third region of the base; a semiconductor film having one or more low-resistance regions, being provided between the first wiring line and the base in the first region, and being in contact with the first wiring line in the second region; a second wiring line provided closer to the base than the semiconductor film is, and being in contact with the first wiring line in the third region; an insulating film provided between the first wiring line and the semiconductor film in the first region; and a semiconductor auxiliary layer provided in contact with the semiconductor film at least in the first region, and assisting electrical coupling that is via the first region.

According to one embodiment of the technology, there is provided a display unit including a display element and a semiconductor device configured to drive the display element. The semiconductor device includes: a base having a first region, a second region, and a third region, the first region, the second region, and the third region being provided in this order along a predetermined direction and adjacent to each other; a first wiring line provided in the first region, the second region, and the third region of the base; a semiconductor film having one or more low-resistance regions, being provided between the first wiring line and the base in the first region, and being in contact with the first wiring line in the second region; a second wiring line provided closer to the base than the semiconductor film is, and being in contact with the first wiring line in the third region; an insulating film provided between the first wiring line and the semiconductor film in the first region; and a semiconductor auxiliary layer provided in contact with the semiconductor film at least in the first region, and assisting electrical coupling that is via the first region.

According to one embodiment of the technology, there is provided a semiconductor substrate including: a first transistor configured to control an electric current flowing in a self-luminescent element; a second transistor configured to control a voltage to be applied to a gate of the first transistor; and a storage capacitor configured to hold a voltage between the gate and a source of the first transistor. The second transistor includes: an oxide semiconductor layer having a channel region and a low-resistance region, the low-resistance region being electrically coupled to the gate of the first transistor and having a resistance lower than a resistance of the channel region; and a semiconductor auxiliary layer provided in contact with the low-resistance region and assisting electrical coupling that is via the low-resistance region. The storage capacitor includes a first metal layer opposed to the semiconductor auxiliary layer across a first insulating layer. The first metal layer and the semiconductor auxiliary layer that are opposed to each other across the first insulating layer serve as a first capacitor.

According to one embodiment of the technology, there is provided a luminescent unit including: a semiconductor substrate; a light-emitting panel provided on the semiconductor substrate, the light-emitting panel including a plurality of pixels each having a self-luminescent element; and a driving circuit configured to drive the light-emitting panel. The second transistor includes: an oxide semiconductor layer having a channel region and a low-resistance region, the low-resistance region being electrically coupled to the gate of the first transistor and having a resistance lower than a resistance of the channel region; and a semiconductor auxiliary layer provided in contact with the low-resistance region and assisting electrical coupling that is via the low-resistance region. The storage capacitor includes a first metal layer opposed to the semiconductor auxiliary layer across a first insulating layer. The first metal layer and the semiconductor auxiliary layer that are opposed to each other across the first insulating layer serve as a first capacitor.

BRIEF DESCRIPTION OF THE DRAWINGS

The accompanying drawings are included to provide a further understanding of the technology and are incorporated in and constitute a part of this specification. The drawings illustrate example embodiments and, together with the specification, serve to explain the principles of the technology.

DETAILED DESCRIPTION

Figure 1:
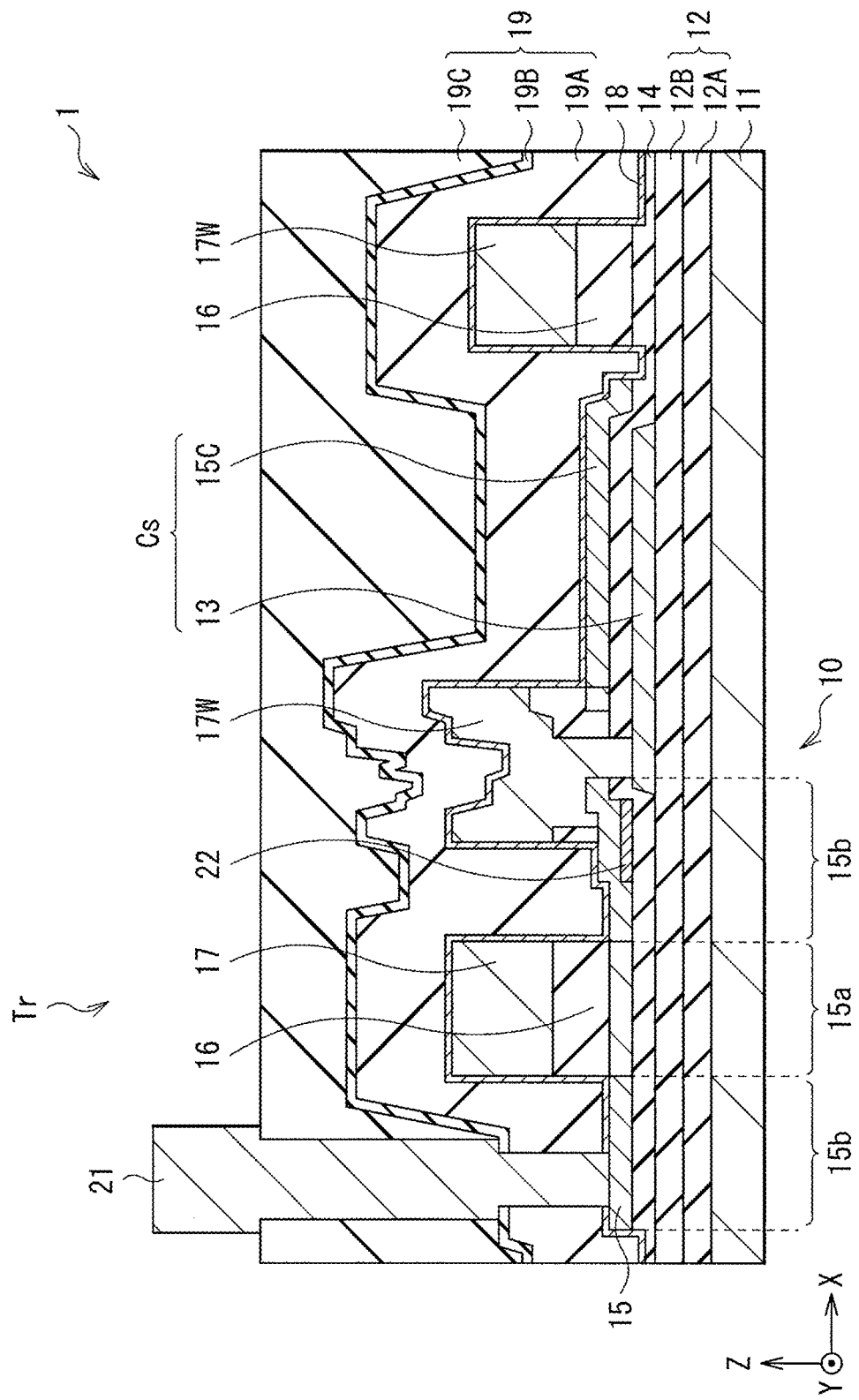
FIG. 1 is a schematic cross-sectional view of a semiconductor device according to one embodiment of the technology.

Some example embodiments of the technology will now be described in detail with reference to the attached drawings. Note that the description is given in the following order.
1. First Embodiment (Example Semiconductor Device Including Semiconductor Auxiliary Layer in Contact with Semiconductor Film in First Region)
2. Second Embodiment (Example Organic Electroluminescent Unit Including Semiconductor Auxiliary Layer Serving First Capacitor)
3. Application Example 1 (Example Display Unit and Example Imaging Unit)
4. Application Example 2 (Example Electronic Apparatus)

In the following, some example embodiments of the technology are described in detail, in the following order, with reference to the accompanying drawings. Note that the following description is directed to illustrative examples of the technology and not to be construed as limiting to the technology. Factors including, without limitation, numerical values, shapes, materials, components, positions of the components, and how the components are coupled to each other are illustrative only and not to be construed as limiting to the technology. Further, elements in the following example embodiments which are not recited in a most-generic independent claim of the technology are optional and may be provided on an as-needed basis. The drawings are schematic and are not intended to be drawn to scale. Note that the like elements are denoted with the same reference numerals, and any redundant description thereof will not be described in detail.

First Embodiment

[Configuration]

FIG. 1 is a schematic cross-sectional view of a semiconductor device 1 according to a first embodiment of the technology. The semiconductor device 1 may be used in a driving circuit for a display unit and an imaging unit, for example. An example of the display unit may include a display unit 2A illustrated in FIG. 16 described below. An example of the imaging unit may include an imaging unit 2B illustrated in FIG. 17 described below. The semiconductor device 1 may include a top-gate thin-film transistor Tr and a storage capacitor Cs. The transistor Tr and the storage capacitor Cs may be electrically coupled to each other by a contact 10.

The transistor Tr may include a semiconductor film 15, a second insulating film 16, and a gate electrode 17 that are provided in this order on a first insulating film 14. The first insulating film 14 may be provided on an under-coat (UC) film 12, which is provided on a base 11. The semiconductor film 15 has low-resistance regions 15b electrically coupled to a source-drain electrode 21. The low-resistance regions 15b are described below.

The storage capacitor Cs includes a lower electrode 13 and an upper electrode 15C that are provided on the UC film 12, which is on the base 11. The lower electrode 13 may correspond to a specific but non-limiting example of "second wiring line" according to one embodiment of the technology. The first insulating film 14 may be provided between the lower electrode 13 and the upper electrode 15C. A gate wiring line 17W is provided in the contact 10. The semiconductor film 15 and the lower electrode 13 may be electrically coupled to each other by the gate wiring line 17W. The gate wiring line 17W may correspond to a specific but non-limiting example of "first wiring line" according to one embodiment of the technology. The semiconductor device 1 may include a metal oxide film 18 and an interlayer insulating film 19, in this order, on the gate electrode 17 and the gate wiring line 17W. The source-drain electrode 21 may be provided on the interlayer insulating film 19, and may be coupled to the semiconductor film 15 via a through-hole. The through hole may extend through the interlayer insulating film 19 and the metal oxide film 18.

The semiconductor film 15 may include a channel region 15a of the transistor Tr. The channel region 15a may be opposed to the gate electrode 17. The low-resistance regions 15b may be provided adjacent to respective sides of the channel region 15a. The low-resistance regions 15b may each have an electric resistance lower than that of the channel region 15a.

The base 11 may include, for example, glass, quartz, or silicon. Alternatively, the base 11 may include a resin material, such as polyethylene terephthalate (PET), polyimide (PI), polycarbonate (PC), or polyethylene naphthalate (PEN). Still alternatively, the base 11 may be a metal plate, such as stainless steel (SUS), on which an insulating material film is provided, for example.

The UC film 12 may suppress or prevent substances, such as sodium ions, from migrating from the base 11 toward an upper layer. The UC film 12 may include an insulating material, such as silicon nitride (SiN) or silicon oxide (SiO). In an example, the UC film 12 may include a UC film 12A and UC film 12B that are stacked in this order from a position close to the base 11. The UC film 12A may be a silicon nitride (SiN) film, and the UC film 12B may be an oxide silicon (SiO) film, for example. The UC film 12 may extend over the entire surface of the base 11.

[Storage Capacitor Cs]

The lower electrode 13 may be provided in a selective region of the UC film 12. A portion of the lower electrode 13 may be uncovered with the upper electrode 15C and extend to the contact 10. The lower electrode 13 may include, for example, a metal such as molybdenum (Mo), tungsten (W), aluminum (Al), copper (Cu), silver (Ag), or titanium (Ti). Alternatively, the lower electrode 13 may include an alloy, or a laminate of a plurality of metal films. Still alternatively, the lower electrode 13 may include an electrically-conductive material other than metal.

The first insulating film 14 may be provided between the lower electrode 13 and the upper electrode 15C. The first insulating film 14 may be an inorganic insulating film, such as a silicon oxide (SiO) film, a silicon nitride (SiN) film, a silicon oxide nitride (SiON) film, or an aluminum oxide (AlO) film.

The upper electrode 15C may be opposed to the lower electrode 13 with the first insulating film 14 provided therebetween. The upper electrode 15C may be formed in the same process as the semiconductor film 15, for example, as described below. The upper electrode 15C may include the same material as the semiconductor film 15, and have the same thickness as the low-resistance region 15b of the semiconductor film 15. The upper electrode 15C may include, for example, a semiconductor oxide material processed to have a low resistance.

[Transistor Tr]

The semiconductor film 15 may be provided in a selective region of the first insulating film 14. The semiconductor film 15 may include, for example, an oxide semiconductor mainly, but not necessarily mainly, containing an oxide of one or more elements including indium (In), gallium (Ga), zinc (Zn), tin (Sn), titanium (Ti), and niobium (Nb). Specific but non-limiting examples of the material of the semiconductor film 15 may include indium-tin-zinc oxide (ITZO), indium-gallium-zinc oxide (IGZO: InGaZnO), zinc oxide (ZnO), indium-zinc oxide (IZO), indium-gallium oxide (IGO), indium-tin oxide (ITO), and indium oxide (InO). Alternatively, the semiconductor film 15 may include another semiconductor material, such as amorphous silicon, microcrystalline silicon, polycrystalline silicon, or an organic semiconductor. The semiconductor film 15 may have a thickness in a range from about 10 nm to about 300 nm, for example. In one example, the semiconductor film 15 may have a thickness of about 60 nm or less. In the example embodiment of the technology, as the thickness of the semiconductor film 15 is reduced, defects in the semiconductor is reduced in absolute amount, which suppresses a negative shift of a threshold voltage. This enables achievement of the thin-film transistor having an excellent characteristic, such as a high on/off ratio. Furthermore, this reduces a time required for the formation of the semiconductor film 15, resulting in an improvement in productivity.

The low-resistance regions 15b of the semiconductor film 15 may be adjacent to the respective sides of the channel region 15a. One of the low-resistance regions 15b may be coupled to the source-drain electrode 21. The other of the low-resistance regions 15b may extend to the contact 10 and coupled to the lower electrode 13 of the storage capacitor Cs through the gate wiring line 17W.

The second insulating film 16 provided between the semiconductor film 15 and the gate electrode 17 may serve as a gate insulating film. The second insulating film 16 may have the same shape as the gate electrode 17 in plan view. In other words, the transistor Tr may be a thin-film transistor having a self-aligned structure. The second insulating film 16 may be a single-layer film that includes one of materials including silicon oxide (SiO), silicon nitride (SiN), silicon oxide nitride (SiON), and aluminum oxide (AlO). Alternatively, the second insulating film 16 may be a multi-layer film that includes two or more these materials.

The gate electrode 17 provided on the second insulating film 16 may control a carrier density in the channel region 15a on the basis of a gate voltage (Vg) applied thereto, and serve as a wiring line that supplies a potential. The gate electrode 17 may include one of metals including titanium (Ti), tungsten (W), tantalum (Ta), aluminum (Al), molybdenum (Mo), silver (Ag), neodymium (Nd), and copper (Cu), or an alloy of two or more of these metals. Alternatively, the gate electrode 17 may be a compound that includes one or more of these metals or may be a multi-layer film that includes two or more of these metals. Still alternatively, the gate electrode 17 may be a transparent electrically-conductive film that includes ITO, for example.

In one example, the metal oxide film 18 may extend over the entire surface of the base 11 so as to cover the gate electrode 17 and the gate wiring line 17W and so as to be in contact with the low-resistance regions 15b of the semiconductor film 15. The metal oxide film 18 may be, for example, an aluminum oxide ($Al_2O_3$) film. Such a metal oxide film 18 in contact with the low-resistance regions 15b helps to stably maintain the electric resistance of the low-resistance regions 15b.

In one example, the interlayer insulating film 19 may extend over the entire surface of the base 11. The interlayer insulating film 19 may be a multi-layer film that includes, for example, an interlayer insulating film 19A, an interlayer insulating film 19B, and an interlayer insulating film 19C, in this order from a position close to the metal oxide film 18. The interlayer insulating film 19A may include, for example, silicon oxide (SiO). Alternatively, the interlayer insulating film 19A may include, for example, silicon nitride (SiN) or silicon oxide nitride (SiON). The interlayer insulating film 19B may include, for example, aluminum oxide (AlO). The interlayer insulating film 19C may be a resin film having photosensitivity, for example. In one example, the interlayer insulating film 19C may include a polyimide resin. In another example, the interlayer insulating film 19C may include a novolak resin or an acrylic resin, for example.

The source-drain electrode 21 may serve as the source or drain of the transistor Tr. In one example, the source-drain electrode 21 may include one of the metals and the transparent electrically-conductive film described above as the materials for the gate electrode 17. For example, the source-drain electrode 21 may include a material having high electrical conductivity. The source-drain electrode 21 may be a multi-layer film that includes, in this order, a Ti film having a thickness of about 50 nm, an AlSi film having a thickness of about 500 nm, and a Ti film having a thickness of about 50 nm, for example.

[Contact 10]

Figure 2:
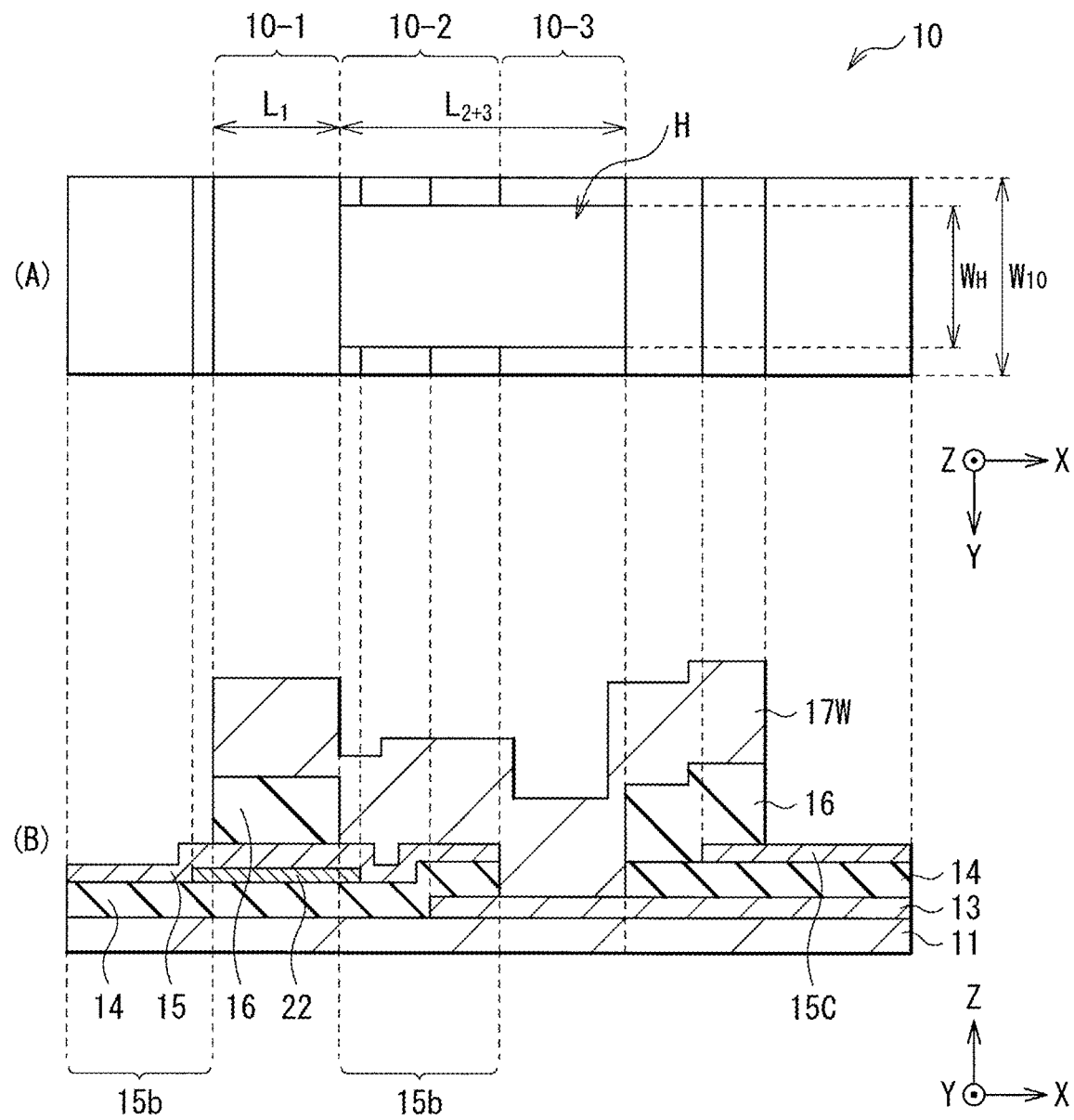
FIG. 2 illustrates a contact illustrated in FIG. 1, in which (A) of FIG. 2 is a plan view of the contact, and (B) of FIG. 2 is a cross-sectional view of the contact.

The configuration of the contact 10 according to an example embodiment of the technology will now be described with reference to FIG. 2. A planar configuration of the contact 10 is illustrated in (A) of FIG. 2, and a cross-sectional configuration of the contact 10 is illustrated in (B) of FIG. 2. In the contact 10, a first region 10-1, a second region 10-2, and a third region 10-3 are provided in this order from a position close to the transistor Tr, along a direction in which the wiring line extends (i.e., along a direction in which the transistor Tr and the storage capacitor Cs are arranged, or along an X-axis in FIG. 2). The first region 10-1, the second region 10-2, and the third region 10-3 are provided adjacent to each other. A contact hole H may be provided in the second region 10-2 and the third region 10-3. The semiconductor film 15 and the gate wiring line 17W are in contact with each other in the second region 10-2. The lower electrode 13 and the gate wiring line 17W are in contact with each other in the third region 10-3. Note that illustration of the UC film 12 is omitted in FIG. 2.

In the first region 10-1, the UC film 12, the first insulating film 14, a semiconductor auxiliary layer 22, the semiconductor film 15, the second insulating film 16, and the gate wiring line 17W may be provided in this order on the base 11. In other words, the semiconductor film 15 may be covered with the second insulating film 16 in the first region 10-1. Although described in detail below, such a first region 10-1 according to the example embodiment helps to suppress an influence to be imposed on the semiconductor film 15 during the formation of an upper layer above the semiconductor film 15 and enhance contact stability.

In the first region 10-1, the second insulating film 16 and the gate wiring line 17W are provided on the semiconductor film 15. In view of the structure, the first region 10-1 seems to have characteristics similar to the transistor; however, actually, the semiconductor film 15 in the first region 10-1 may serve as a conductor. One reason for this is that the semiconductor film 15 has the one or more low-resistance regions 15b, and that high-density carriers contained in the low-resistance region(s) 15b diffuse into the first region 10-1. For example, the semiconductor film 15 may have the low-resistance regions 15b in regions adjacent to respective sides of the first region 10-1 (i.e., in a region adjacent to the transistor Tr and in the second region 10-2). The semiconductor film 15 may extend to the first region 10-1 and the second region 10-2 of the contact 10.

In the example embodiment, the semiconductor auxiliary layer 22 is provided in contact with the semiconductor film 15 in the first region 10-1. The semiconductor auxiliary layer 22 assists electrical coupling between the transistor Tr and the storage capacitor Cs via the first region 10-1. In one example, the semiconductor auxiliary layer 22 may supply carriers to the first region 10-1 of the semiconductor film 15. The property of the semiconductor auxiliary layer 22 is hereinafter also referred to as "carrier-supplying property". This enhances electrical conductivity of the semiconductor film 15 in the first region 10-1. In another example, the semiconductor auxiliary layer 22 may have electrical conductivity. This allows the semiconductor auxiliary layer 22 to serve as a conductor in the first region 10-1, causing an electrical current to flow through the semiconductor auxiliary layer 22.

The semiconductor auxiliary layer 22 may include, for example, metal or an oxide semiconductor processed to have a low resistance. In one example, the semiconductor auxiliary layer 22 may include an aluminum-silicon alloy (AlSi), aluminum (Al), IZO, ITO, or any other material usable for the oxide semiconductor material. For the semiconductor auxiliary layer 22 that includes the oxide semiconductor material, the oxide semiconductor material may include a material different from the oxide semiconductor materials of the source region 132 and the drain region 133, or may have different composition from the oxide semiconductor material of the semiconductor film 15. The semiconductor auxiliary layer 22 that includes such a wet-etchable material helps to suppress an influence to be imposed on the first insulating film 14 during the formation of the semiconductor auxiliary layer 22. The semiconductor auxiliary layer 22 may have a thickness within a range from about 5 nm to about 25 nm, for example. Such a semiconductor auxiliary layer 22 having the carrier-supplying property and electrical conductivity maintains the electrical coupling via the first region 10-1 even if the diffusion or infiltration of the carriers from the low-resistance region 15b of the semiconductor film 15 to the first region 10-1 is insufficient.

The semiconductor auxiliary layer 22 may be provided between the first insulating film 14 and the semiconductor film 15, and may be in contact with a lower surface, adjacent to the base 11, of the semiconductor film 15, for example. In one example, the semiconductor auxiliary layer 22 may extend beyond the first region 10-1; for example, the semiconductor auxiliary layer 22 may extend beyond the first region 10-1 to regions adjacent to the respective sides of the first region 10-1 (i.e., a region adjacent to the transistor Tr and the second region 10-2). In another example, the semiconductor auxiliary layer 22 may extend over a larger region; for example, the semiconductor auxiliary layer 22 may be provided in contact with the entire semiconductor film 15 other than the channel region 15*a*.

The second insulating film 16 in contact with an upper surface of the semiconductor film 15 may be provided only in the first region 10-1 of the contact 10. In other words, the region in which the second insulating film 16 is provided may be the first region 10-1. The second insulating film 16 in the first region 10-1 may be formed in the same process as the second insulating film 16 of the transistor Tr. In other words, the second insulating film 16 in the first region 10-1 may have a material and thickness the same as those of the second insulating film 16 of the transistor Tr.

The gate wiring line 17W extends to the first region 10-1, the second region 10-2, and the third region 10-3 of the contact 10. An end face of the gate wiring line 17W in the first region 10-1 may be located at a similar or the same position as an end face of the second insulating film 16 in plan view. The gate wiring line 17W may be formed in the same process as the gate electrode 17 of the transistor Tr. In other words, the gate wiring line 17W may have a material and thickness the same as those of the gate electrode 17 of the transistor Tr.

In the second region 10-2, the UC film 12, the first insulating film 14, the semiconductor film 15, and the gate wiring line 17W may be provided in this order on the base 11. In other words, in the second region 10-2, the gate wiring line 17W is in contact with the upper surface of the semiconductor film 15 through the contact hole H provided in the second insulating film 16. Additionally, the semiconductor auxiliary layer 22 may be provided in contact with the lower surface of the semiconductor film 15 in the second region 10-2.

In the third region 10-3, the UC film 12, the lower electrode 13, and the gate wiring line 17W may be provided in this order on the base 11. In other words, in the third region 10-3, the lower electrode 13 is in contact with the gate wiring line 17W through the contact hole H provided in the first insulating film 14 and the second insulating film 16. For example, the lower electrode 13 may extend beyond the third region 10-3 to a portion of the second region 10-2. In the second region 10-2, the first insulating film 14 may be provided between the lower electrode 13 and the semiconductor film 15.

The lower electrode 13, the semiconductor film 15, and the gate wiring line 17W may each have a linewidth $W_{10}$ of about 5 μm or less along a Y-axis, for example. The linewidth $W_{10}$ refers to a dimension of each of the lower electrode 13, the semiconductor film 15, and the gate wiring line 17W along a direction orthogonal to a current flow. The contact hole H may have a width $W_H$ of about 3 μm along the Y-axis, for example. The contact hole H may have a length $L_{2+3}$ of about 4 μm along the X-axis, for example. The width $W_H$ refers to a dimension of the contact hole H along the direction orthogonal to the current flow. The length $L_{2+3}$ refers to a dimension of the contact hole along a direction parallel to the current flow.

Figure 3:
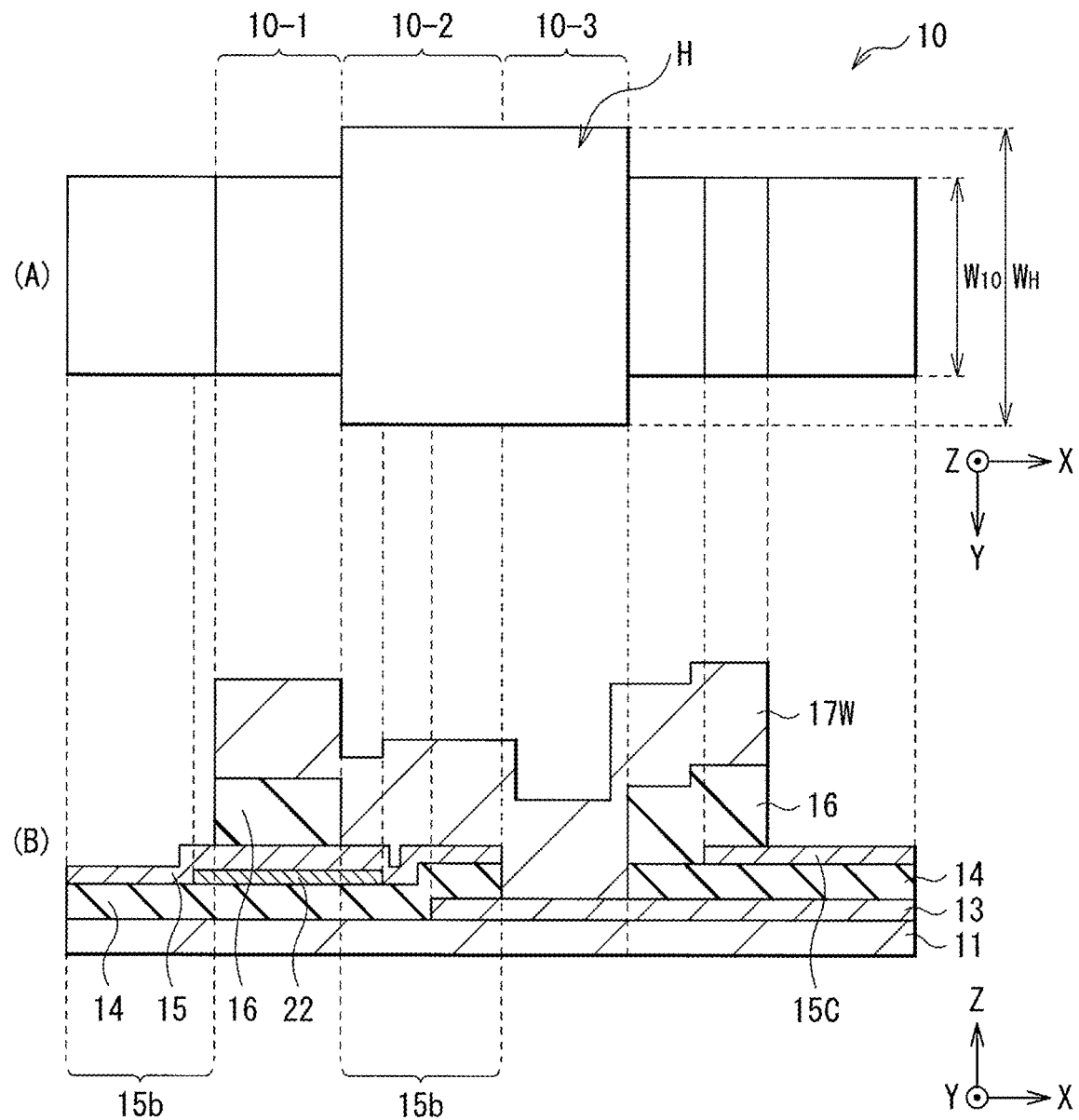
FIG. 3 illustrates another example of the contact illustrated in FIG. 2, in which (A) of FIG. 3 is a plan view of the other example of the contact, and (B) of FIG. 3 is a cross-sectional view of the other example of the contact.

In an example illustrated in FIG. 3, the width $W_H$ of the contact hole H may be larger than the linewidth $W_{10}$. As described below, according to the semiconductor device 1 of an example embodiment, the semiconductor film 15 in the contact 10 is suppressed or prevented from reducing in thickness. This allows for stable electrical coupling between the semiconductor film 15 and the lower electrode 13 even in the example where the width $W_H$ of the contact hole H is larger than the linewidth $W_{10}$. Accordingly, it is possible for an example embodiment of the technology to achieve a high-definition semiconductor device having a small linewidth $W_{10}$.

In another example, the gate wiring line 17W may extend beyond the contact 10. The second insulating film 16 having the same shape as the gate wiring line 17W in plan view may be provided between the gate wiring line 17W and the first insulating film 14.

[Manufacturing Method]

The semiconductor device 1 described above may be manufactured through the following example processes illustrated in FIGS. 4A to 5B.

Figure 4A:
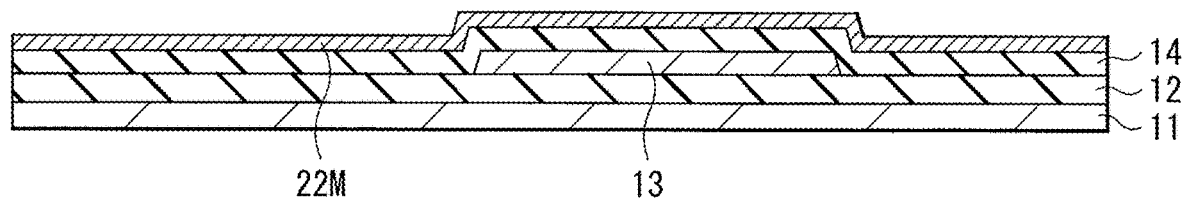
FIG. 4A is a schematic cross-sectional diagram illustrating an example process of manufacturing the semiconductor device of FIG. 1.

Firstly, with reference to FIG. 4A, the UC film 12, the lower electrode 13, and the first insulating film 14 may be formed in this order on the base 11. For example, these layers may be formed as follows. The UC film 12 may be formed first over the entire surface of the base 11. To form the UC film 12, a silicon nitride (SiN) film having a thickness about 50 nm and a silicon oxide (SiO) film having a thickness of about 100 nm may be formed in this order on the base 11 by chemical vapor deposition (CVD), for example. Thereafter, a titanium (Ti) film may be formed on the UC film 12 by sputtering, for example, and may be patterned into a predetermined shape by photolithography and dry etching. The lower electrode 13 may be thereby formed. Thereafter, a silicon oxide (SiO) film having a thickness about 100 nm may be formed over the entire surface of the base 11 by CVD so as to cover the lower electrode 13. The first insulating film 14 may be thereby formed.

Figure 4B:
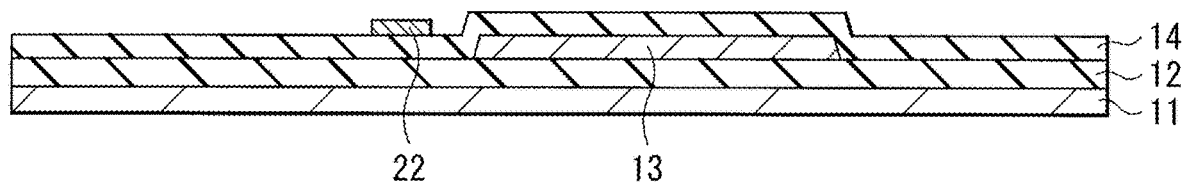
FIG. 4B is a schematic cross-sectional diagram illustrating an example process following the process of FIG. 4A.

After forming the first insulating film 14, with reference to FIG. 4B, the semiconductor auxiliary layer 22 may be formed. For example, the semiconductor auxiliary layer 22 may be formed as follows. Firstly, an AlSi film may be formed by sputtering, for example, over the entire surface of the first insulating film 14. Thereafter, the AlSi film may be patterned into a predetermined shape by photolithography or wet-etching. The semiconductor auxiliary layer 22 may be thereby formed in a selective region on the first insulating film 14. The selective region may include the first region 10-1. In this example, the semiconductor auxiliary layer 22 may be formed by wet-etching. The formation of the semiconductor auxiliary layer 22 by means of wet-etching suppresses an influence to be imposed on the first insulating film 14 below the semiconductor auxiliary layer 22.

Figure 4C:
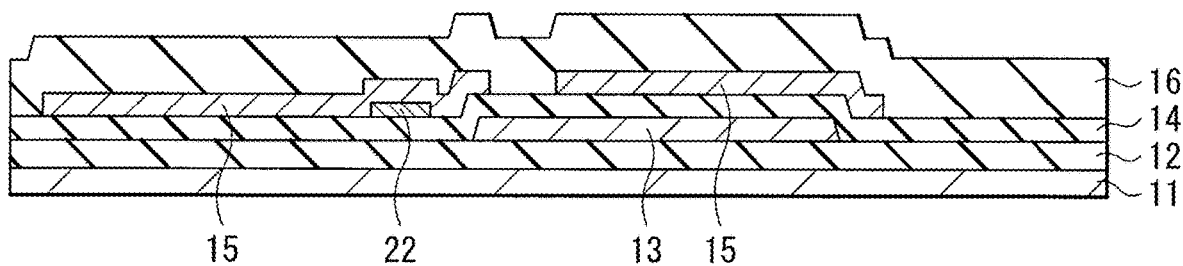
FIG. 4C is a schematic cross-sectional diagram illustrating an example process following the process of FIG. 4B.

Thereafter, with reference to FIG. 4C, the semiconductor film 15 and the second insulating film 16 may be formed in this order. For example, these films may be formed as follows. Firstly, an oxide semiconductor film may be formed over the entire surface of the base 11 by sputtering, for example, and may be patterned into a predetermined shape by photolithography or wet-etching, for example. Thereafter, a resist may be removed, and annealing may be performed. The semiconductor film 15 may be thereby formed on the semiconductor auxiliary layer 22 and the first insulating film 14. Thereafter, an oxide silicon (SiO) film having a thickness of about 200 nm may be formed over the entire surface of the base 11 by CVD, for example, so as to cover the semiconductor film 15. The second insulating film 16 may be thereby formed.

Figure 4D:
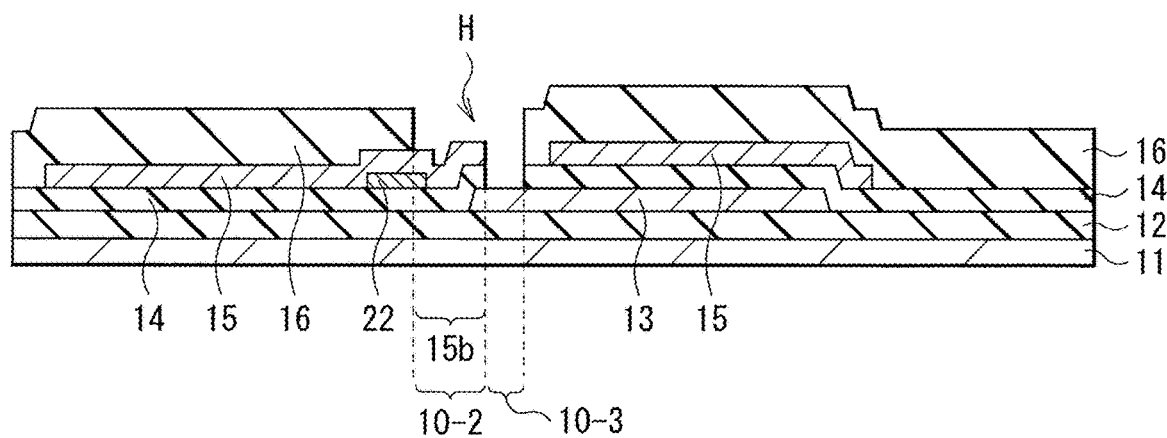
FIG. 4D is a schematic cross-sectional diagram illustrating an example process following the process of FIG. 4C.
Figure 4E:
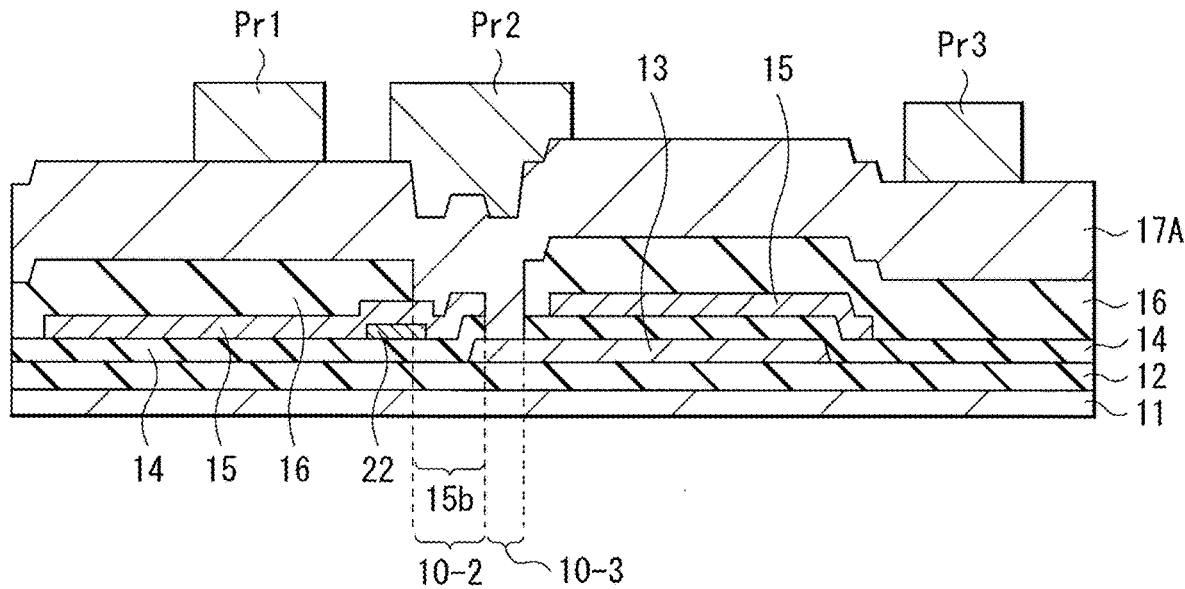
FIG. 4E is a schematic cross-sectional diagram illustrating an example process following the process of FIG. 4D.

After forming the second insulating film 16, with reference to FIG. 4D, the second insulating film 16 in the second region 10-2 and the third region 10-3 and the first insulating film 14 in the third region 10-3 may be selectively removed to thereby form the contact hole H. The contact hole H may be formed by photolithography and dry-etching, for example. At this stage, the semiconductor film 15 in the second region 10-2 may be subjected to dry-etching to thereby form the low-resistance region 15b in the second region 10-2.

After forming the contact hole H, an electrically-conductive film 17A that includes, for example, a metal material may be formed over the entire surface of the base 11. Thereafter, with reference to FIG. 4E, photoresists Pr1, Pr2, and Pr3 each having a predetermined pattern may be formed on the electrically-conductive film 17A. The photoresist Pr1 may be used to form the gate electrode 17 and the second insulating film 16 of the transistor Tr. The photoresist Pr2 may be used to form the gate wiring line 17W and the second insulating film 16 (i.e., the first region 10-1) of the contact 10. The photoresist Pr3 may be used to form the gate wiring line 17W and the second insulating film 16 in a region other than the contact 10.

Figure 5A:
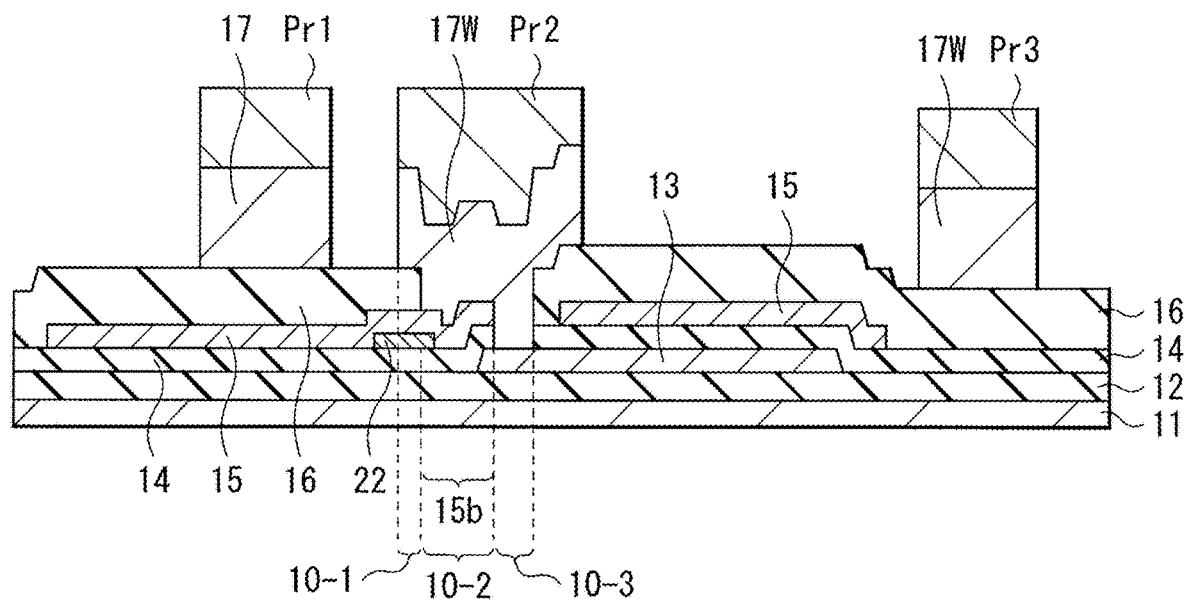
FIG. 5A is a schematic cross-sectional diagram illustrating an example process following the process of FIG. 4E.
Figure 5B:
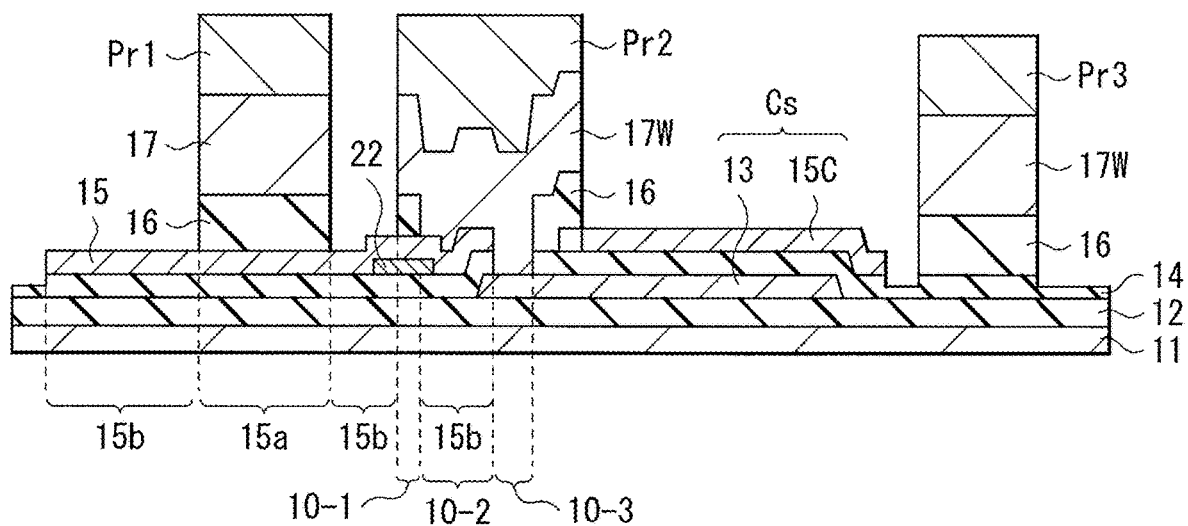
FIG. 5B is a schematic cross-sectional diagram illustrating an example process following the process of FIG. 5A.

With the use of the photoresists Pr1, Pr2, and Pr3, the electrically-conductive film 17A and the second insulating film 16 may be sequentially patterned, as illustrated in FIGS. 5A and 5B. With reference to FIG. 5A, the electrically-conductive film 17A may be patterned first by dry-etching to thereby form the gate electrode 17 and the gate wiring line 17W. In this example embodiment, the semiconductor film 15 in the first region 10-1 may be covered with the second insulating film 16 at this stage and may thus not be subjected to the dry-etching. Therefore, the semiconductor film 15 in the first region 10-1 is suppressed or prevented from reducing in thickness and thus retains a predetermined thickness. After forming the gate electrode 17 and the gate wiring line 17W, the second insulating film 16 may be patterned. Through the patterning, the second insulating film 16 may be divided into three second insulating films 16, namely, a second insulating film 16 having the same shape as the gate electrode 17 in plan view, a second insulating film 16 provided in the first region 10-1, and a second insulating film 16 having the same shape as the gate wiring line 17W in plan view. At this stage, a portion of the semiconductor film 15 uncovered with the second insulating film 16 may be processed to have a low resistance by dry-etching, so that the low-resistance region 15b of the transistor Tr and the upper electrode 15C of the storage capacitor Cs may be thereby formed.

Thereafter, the metal oxide film 18 and the interlayer insulating film 19 may be formed over the entire surface of the base 11. For example, these films may be formed as follows. Firstly, an aluminum oxide (AlO) film having a thickness of about 10 nm, a silicon oxide (SiO) film having a thickness of about 100 nm, and an aluminum oxide film having a thickness of about 50 nm may be formed in this order by sputtering, for example. The metal oxide film 18 and the interlayer insulating films 19A and 19B may be thereby formed. Thereafter, a through-hole may be formed in the interlayer insulating films 19A and 19B by photolithography and dry-etching. The source-drain electrode 21 may be coupled to the semiconductor film 15 via the through-hole. Thereafter, for example, a polyimide film may be formed on the interlayer insulating film 19B, followed by photolithography, annealing, and dry-etching. The interlayer insulating film 19C may be thereby formed. The interlayer insulating film 19C and the metal oxide film 18 may have a through-hole formed by the dry-etching. The through-hole may be communicated with the through-hole in the interlayer insulating films 19A and 19B. Finally, the source-drain electrode 21 may be formed on the interlayer insulating film 19, so that the semiconductor device 1 illustrated in FIG. 1 may be completed.

In one example, all the processes for manufacturing the semiconductor device 1 after the formation of the semiconductor film may be performed at a temperature of about 400° C. or lower. This helps to suppress a characteristic deterioration of the semiconductor film 15 caused by oxygen deficiency, hydrogen diffusion, or movable ions.

[Example Workings and Effects]

In the semiconductor device 1 according to the example embodiment of the technology, the channel region 15a of the semiconductor film 15 is activated upon application of an ON voltage equal to or greater than a threshold voltage to the gate electrode 17. This causes an electrical current to flow between the paired low-resistance regions 15b. In response to this, an electrical current flows from the semiconductor film 15 to the lower electrode 13 through the gate wiring line 17W in the contact 10, so that an electrical charge is held in the storage capacitor Cs.

The semiconductor device 1 according to the example embodiment may include the contact 10 having the first region 10-1 in which the second insulating film 16 is provided on the semiconductor film 15. This helps to suppress an influence to be imposed on the semiconductor film 15 during the formation of an upper layer above the semiconductor film 15. This effect will now be described with reference to a comparative example.

Figure 6:
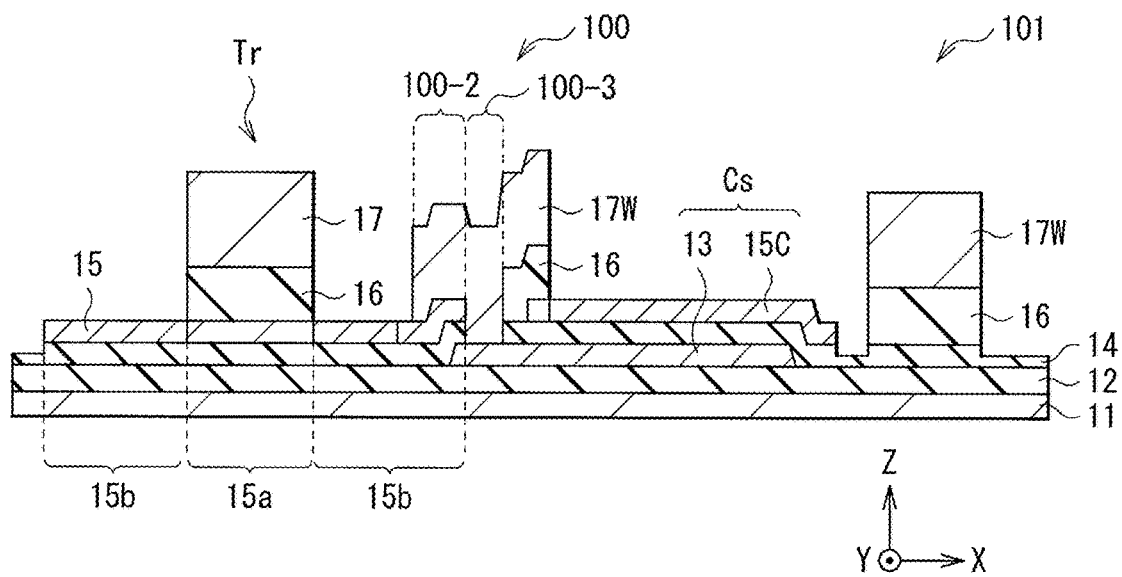
FIG. 6 is a schematic cross-sectional view of a semiconductor device according to Comparative Example 1.

FIG. 6 illustrates a schematic cross-sectional configuration of a semiconductor device 101 according to Comparative Example 1. The semiconductor device 101 may have a contact 100 that includes a second region 100-2 and a third region 100-3 that are provided adjacent to each other. In the second region 100-2, the gate wiring line 17W is in contact with the semiconductor film 15. In the third region 100-3, the gate wiring line 17W is in contact with the lower electrode 13. In a region between the second region 100-2 and the gate electrode 17, the semiconductor film 15 is not covered with the second insulating film 16. In other words, a first region (e.g., the first region 10-1 illustrated in FIG. 2) is not provided in the contact 100.

Figure 7A:
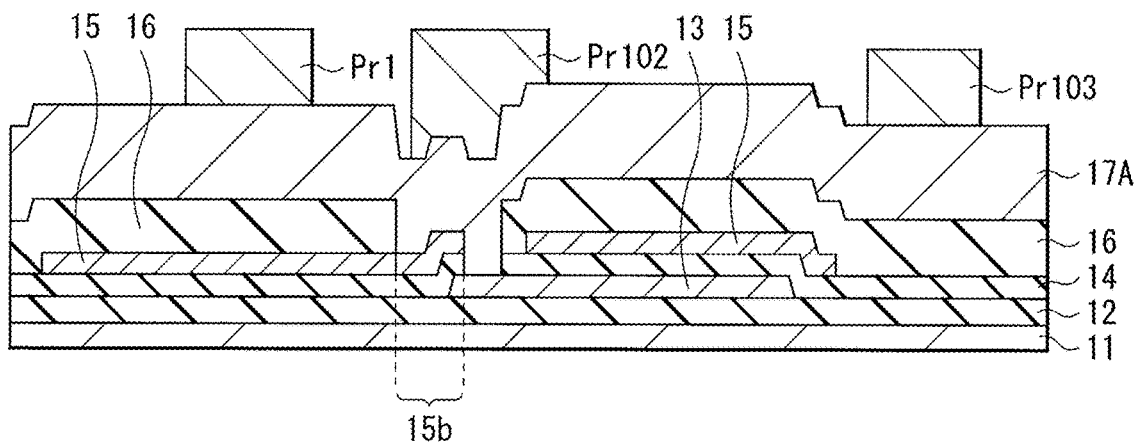
FIG. 7A is a schematic cross-sectional diagram illustrating an example process of manufacturing the semiconductor device of FIG. 6.
Figure 7B:
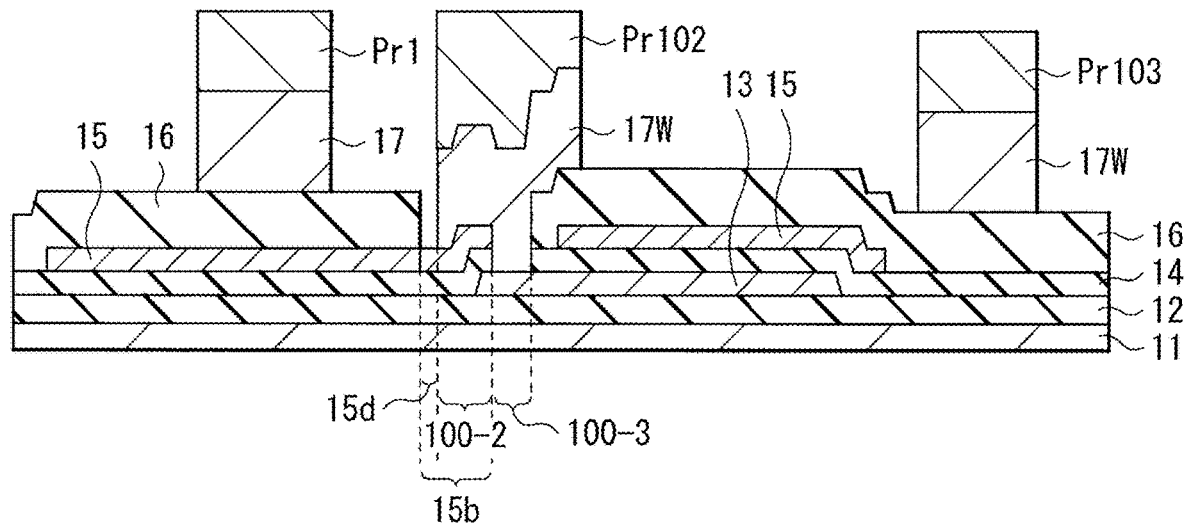
FIG. 7B is a schematic cross-sectional diagram illustrating an example process following the process of FIG. 7A.
Figure 7C:
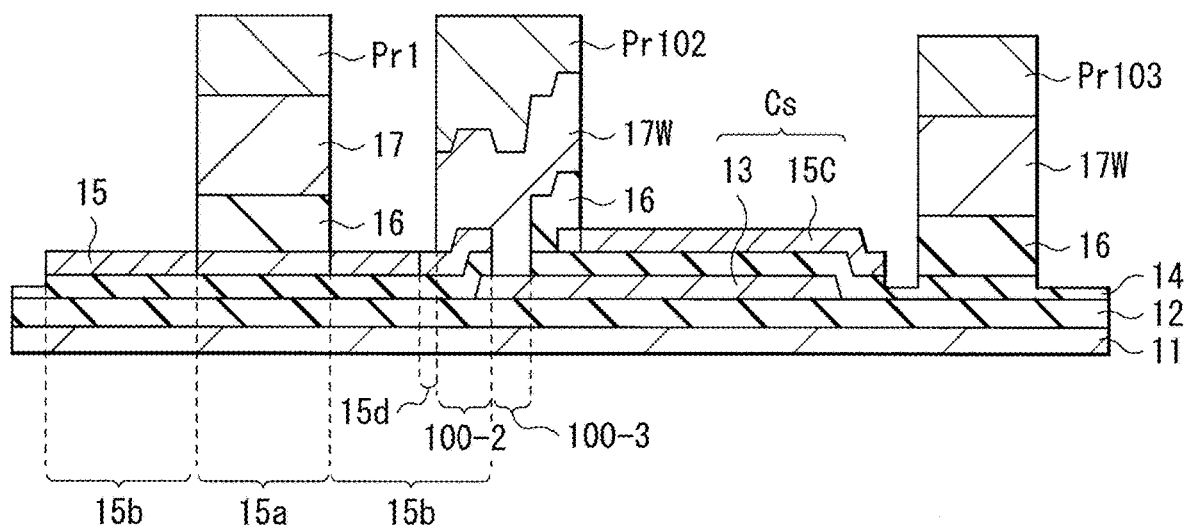
FIG. 7C is a schematic cross-sectional diagram illustrating an example process following the process of FIG. 7B.

Such a semiconductor device 101 is manufactured through the following example processes illustrated in FIGS. 7A to 7C.

Firstly, as in the manufacture of the semiconductor device 1, the UC film 12, the lower electrode 13, the first insulating film 14, the semiconductor film 15, the second insulating film 16, and the electrically-conductive film 17A are formed on the base 11.

Thereafter, with reference to FIG. 7A, the photoresists Pr1, Pr102, and Pr103 each having a predetermined pattern are formed on the electrically-conductive film 17A. The photoresist Pr102 is used to form the gate wiring line 17W of the contact 100. With the use of the photoresists Pr1, Pr102, and Pr103, the electrically-conductive film 17A and the second insulating film 16 are patterned, as illustrated in FIGS. 7B and 7C.

With reference to FIG. 7B, in the semiconductor device 101 that includes no first region, a portion of the semiconductor film 15 adjacent to one end, opposite to the other end adjacent of the third region 100-3, of the second region 100-2 is uncovered with the second insulating film 16, during the etching of the electrically-conductive film 17A. The region of the semiconductor film 15 uncovered with the second insulating film 16 is hereinafter referred to as "uncovered region 15d". The semiconductor film 15 in the uncovered region 15d is not protected by the second insulating film 16 and thus subjected to etching while the electrically-conductive film 17A is being etched.

Figure 8:
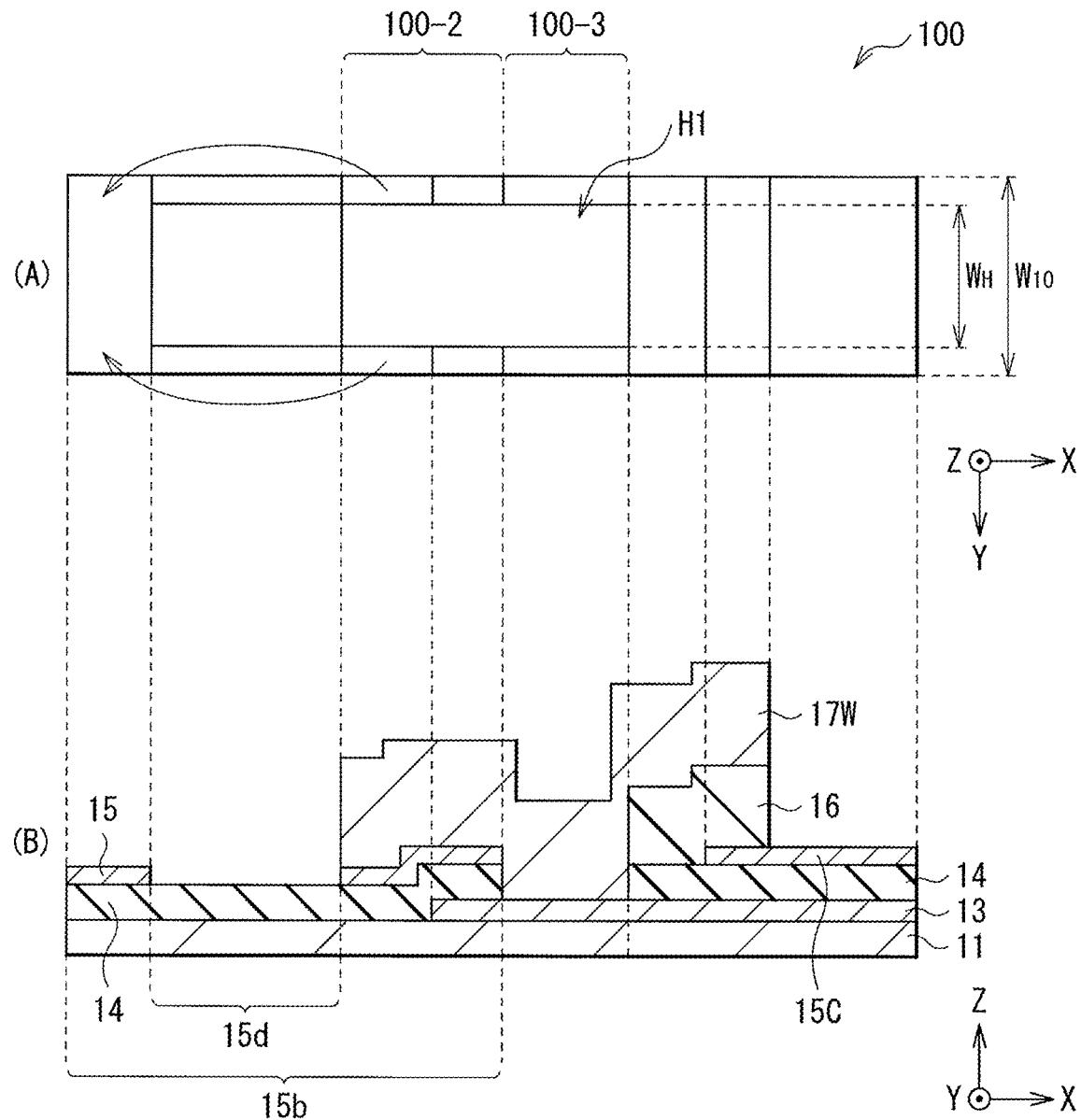
FIG. 8 illustrates an example configuration of a contact formed through the processes of FIGS. 7A to 7C, in which (A) of FIG. 8 is a plan view of the contact and (B) of FIG. 8 is a cross-sectional view of the contact.

FIG. 8 illustrates the configuration of the contact 100 and its surroundings that are formed through the processes described above. The planar configuration of the contact 100 and the uncovered region 15d is illustrated in (A) of FIG. 8, and the cross-sectional configuration of the contact 100 and the uncovered region 15d is illustrated in (B) of FIG. 8. The semiconductor film 15 in the uncovered region 15d can be reduced in thickness and removed. After the reduction in thickness and removal of the semiconductor film 15 in the uncovered region 15d, an electric current can flow avoiding the uncovered region 15d, which increases the resistance of the semiconductor film 15, resulting in unstable coupling between the semiconductor film 15 and the lower electrode 13.

In contrast, in the semiconductor device 1 that includes the first region 10-1 in the contact 10, the semiconductor film 15 is protected with the second insulating film 16 without the formation of an uncovered region, such as the uncovered region 15d of FIG. 8, in the semiconductor film 15. This suppresses the reduction in thickness and removal of the semiconductor film 15 and thus maintains in-plane uniformity of the semiconductor film 15. Additionally, stable electrical coupling between the semiconductor film 15 and the lower electrode 13 are thereby established. Accordingly, it is possible to achieve the thin semiconductor film 15 that has an excellent transistor characteristic and that is manufactured with a high productivity, and to stably maintain the electrical coupling between the semiconductor film 15 and the lower electrode 13.

Furthermore, in the semiconductor device 1, the semiconductor auxiliary layer 22 is in contact with the semiconductor film 15 in the first region 10-1. This maintains the electrical coupling via the first region 10-1 more stably. These workings and effects will now be described.

As described above, the second insulating film 16 and the gate wiring line 17W are provided on the semiconductor film 15 in the first region 10-1. In view of the structure, the first region 10-1 seems to have characteristics similar to the transistor; however, actually, the semiconductor film 15 in the first region 10-1 may also serve as a conductor. One reason for this is that the high-density carriers diffuse into the first region 10-1 from the low-resistance regions 15b adjacent to the first region 10-1.

In other words, the semiconductor film 15 in the first region 10-1 has an electrical conductivity depending on the diffusion of the high-density carriers from the low-resistance regions 15b. An insufficient diffusion of the carriers can cause a malfunction of the semiconductor film 15 as a conductor. For example, an improvement in the film quality of the semiconductor film 15 enhances the reliability of the semiconductor device 1 on one hand, but can cause an insufficient carrier diffusion on the other hand.

In the semiconductor device 1 according to the example embodiment, the semiconductor auxiliary layer 22 is in contact with the semiconductor film 15 in the first region 10-1. The semiconductor auxiliary layer 22 assists electrical coupling via the first region 10-1. For example, the semiconductor auxiliary layer 22 may supply the carriers to the semiconductor film 15 in the first region 10-1 to thereby enhance the electrical conductivity of the semiconductor film 15. Alternatively, the semiconductor auxiliary layer 22 may serve as a conductor in the first region 10-1. Such a semiconductor auxiliary layer 22 maintains the electrical coupling between the transistor Tr and the storage capacitor Cs via the first region 10-1 even if the diffusion of the carriers from the low-resistance region 15b to the first region 10-1 is insufficient.

Figure 9:
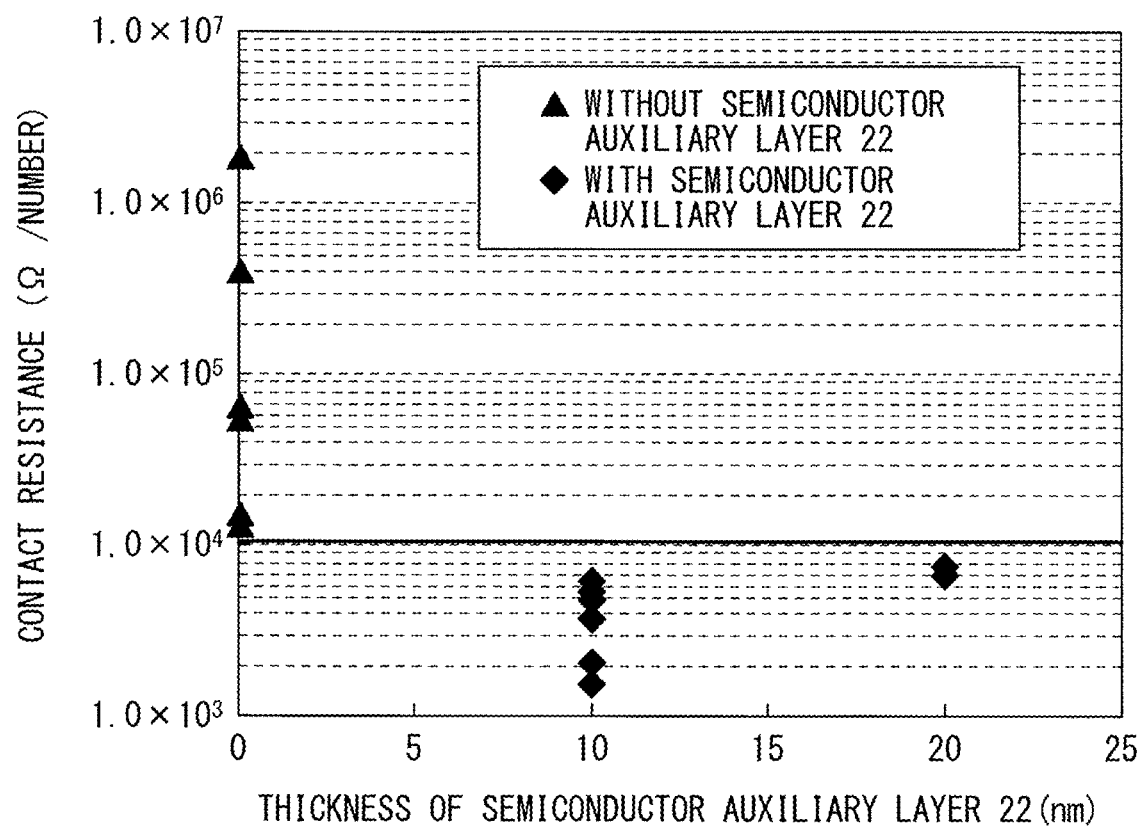
FIG. 9 is a diagram illustrating the contact resistance of the contact of FIG. 2.

FIG. 9 illustrates the contact resistance of the semiconductor device 1 that includes the semiconductor auxiliary layer 22 in the first region 10-1. In FIG. 9, the contact resistance of the semiconductor device that includes the semiconductor auxiliary layer 22 is represented in comparison with the contact resistance of a semiconductor device that includes no semiconductor auxiliary layer 22. It was confirmed as illustrated in FIG. 9 that the semiconductor device 1 that included the semiconductor auxiliary layer 22 in the first region 10-1 had a contact resistance less than $1.0 \times 10^3 \Omega$/number. It is also apparent from FIG. 9 that variations in the contact resistance is suppressed by increasing the thickness of the semiconductor auxiliary layer 22.

Furthermore, even in a case where the first region 10-1 has a large length L1 along the X-axis, the semiconductor auxiliary layer 22 in the first region 10-1 maintains the electrical coupling via the first region 10-1. Accordingly, providing the semiconductor auxiliary layer 22 in the first region 10-1 improves freedom of design.

In the example embodiment described above, the second insulating film 16 is provided between the gate wiring line 17W and the semiconductor film 15 in the first region 10-1. This helps to suppress a reduction in thickness of the semiconductor film 15 and stably maintain the electrical coupling between the semiconductor film 15 and the lower electrode 13. Accordingly, the stability of the contact 10 is enhanced.

Additionally, in the example embodiment described above, the semiconductor auxiliary layer 22 is in contact with the semiconductor film 15 in the first region 10-1. This helps to stably maintain the electrical coupling between the transistor Tr and the storage capacitor Cs via the first region 10-1. Accordingly, the stability of the contact 10 is enhanced.

Second Embodiment

[Configuration]

Figure 10:
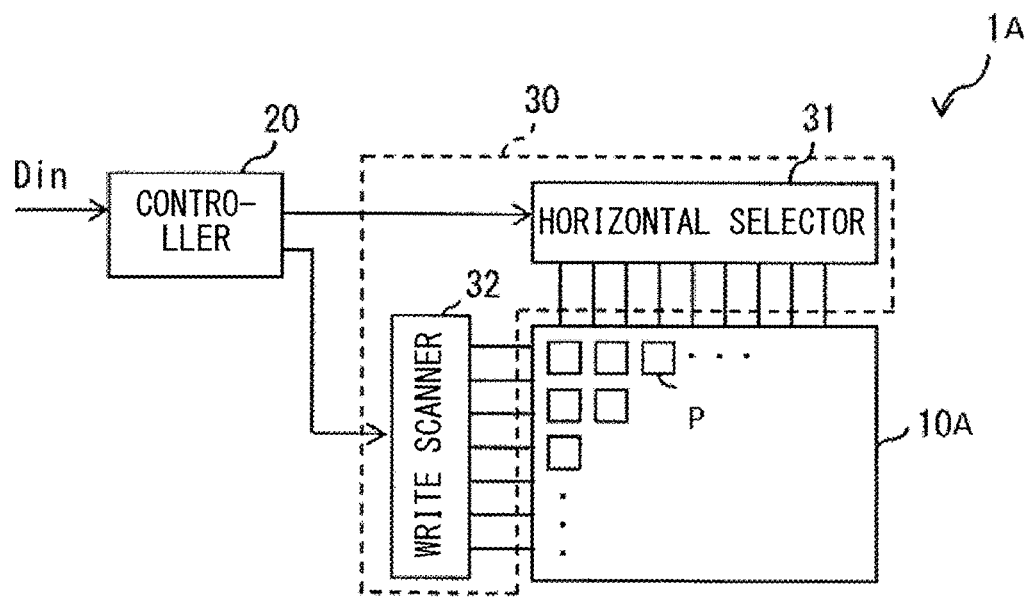
FIG. 10 is a schematic diagram illustrating an example configuration of an organic electroluminescent unit according to one embodiment of the technology.
Figure 11:
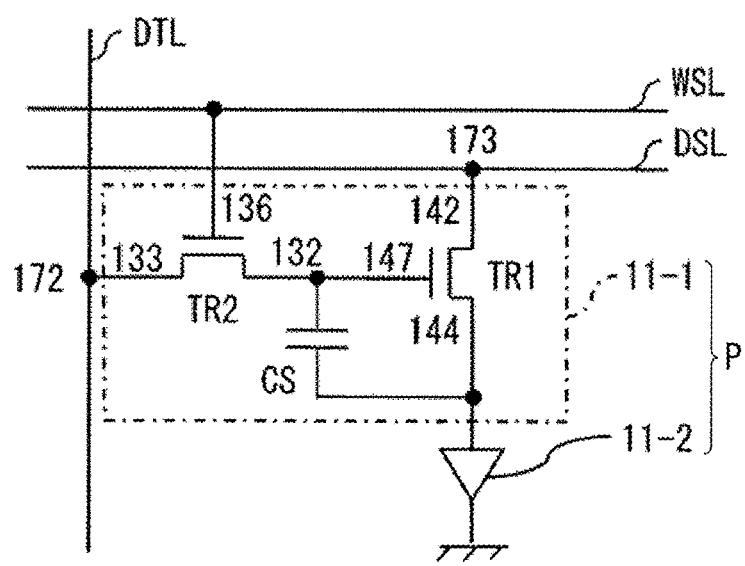
FIG. 11 is a diagram illustrating an example circuit configuration of each pixel of FIG. 10.

FIG. 10 illustrates an example schematic configuration of an organic electroluminescent unit 1A according to a second embodiment of the technology. FIG. 11 illustrates an example circuit configuration of each pixel P in the organic electroluminescent unit 1A. The organic electroluminescent unit 1A may include, for example, an organic electroluminescent panel 10A, a controller 20, and a driver 30. The organic electroluminescent unit 1A may correspond to a specific but non-limiting example of "luminescent unit" according to one embodiment of the technology. The organic electroluminescent panel 10A may correspond to a specific but non-limiting example of "light-emitting panel" according to one embodiment of the technology. The driver 30 may be mounted on an outer edge portion of the organic electroluminescent panel 10A, for example. The organic electroluminescent panel 10A may include a plurality of pixels P arranged in matrix. The controller 20 and the driver 30 may drive the pixels P of the organic electroluminescent panel 10A on the basis of an external image signal Din.

[Organic Electroluminescent Panel 10A]

In response to the active-matrix driving of the pixels P performed by the controller 20 and the driver 30, the organic electroluminescent panel 10A may display an image based on the external image signal Din. Additionally, the organic electroluminescent panel 10A may include multiple scanning lines WSL and multiple power lines DSL that extend in a row direction, multiple signal lines DTL that extend in a column direction, and the multiple pixels P that are arranged in matrix.

The scanning lines WSL may be used to select the pixels P. For example, a selection pulse may be supplied through the scanning lines WSL to the pixels P to select the pixels P on a predetermined unit basis. The pixels P may be selected on a pixel-row basis, for example. The signal lines DTL may be used to supply a signal voltage Vsig based on the image signal Din to the pixels P. For example, a data pulse that includes the signal voltage Vsig may be supplied through the signal lines DTL to the pixels P. The power lines DSL may be used to supply electric power to the pixels P.

Figure 12:
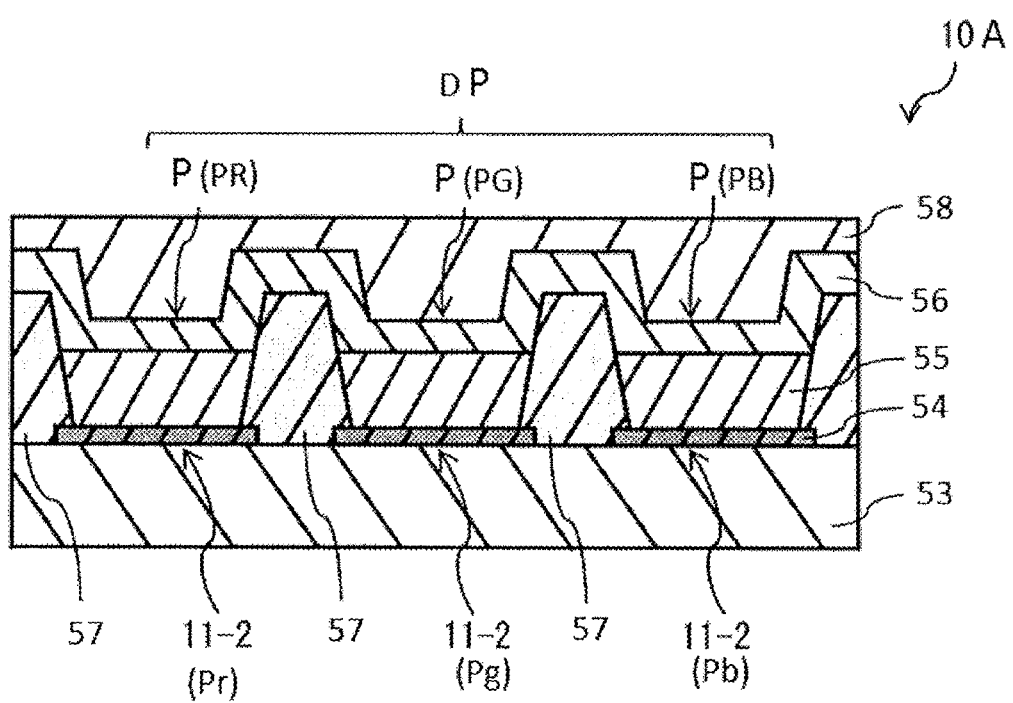
FIG. 12 is an example cross-sectional view of an organic electroluminescent panel of FIG. 10.

The pixels P of the organic electroluminescent panel 10A may include pixels P emitting red light, pixels P emitting green light, and pixels P emitting blue light. Hereinafter, the pixel P emitting red light is referred to as "pixel PR", the pixel P emitting green light as "pixel PG", the pixel P emitting blue light as "pixel PB". Among these pixels P, a combination of the pixels PR, PG, and PB may serve as a display pixel DP, which is a unit of color-image display, as illustrated in FIG. 12 described below. It is to be noted that each display pixel DP may include an additional pixel P that emits light of another color, such as white and yellow. Alternatively, each display pixel DP may include a plurality of pixels P that emit light of the same color. For example, the display pixel DP may include two pixels P that emit blue light. Accordingly, the pixels P of the organic electroluminescent panel 10A may be divided into some groups or display pixels DP on a predetermined number basis. The pixels P in each display pixel DP may be aligned in line along a predetermined direction, for example, the row direction.

The signal lines DTL may be each coupled to an output terminal of a horizontal selector 31 described below. Each of the signal lines DTL may be allocated to its corresponding pixel column, for example. The scanning lines WSL may be each coupled to an output terminal of a write scanner 32 described below. Each of the scanning lines WSL may be allocated to its corresponding pixel row, for example. The power lines DSL may be each coupled to an output terminal of a power source. Each of the power lines DSL may be allocated to its corresponding pixel row, for example.

The pixels P may each include a pixel circuit 11-1 and an organic electroluminescent element 11-2. An example configuration of the organic electroluminescent element 11-2 is described in detail below.

The pixel circuit 11-1 may control light emission and light extinction of the organic electroluminescent element 11-2. The pixel circuit 11-1 may hold a voltage written into its corresponding pixel P through write scanning described below. The pixel circuit 11-1 may include, for example, a driving transistor TR1, a switching transistor TR2, and a storage capacitor CS. The driving transistor TR1 may correspond to a specific but non-limiting example of "first transistor" according to one embodiment of the technology. The switching transistor TR2 may correspond to a specific but non-limiting example of "second transistor" according to one embodiment of the technology.

The switching transistor TR2 may control the application of the signal voltage Vsig to a gate of the driving transistor TR1. The signal voltage Vsig may correspond to the image signal Din. For example, the switching transistor TR2 may sample a voltage of the signal line DTL and write the sampled voltage into the gate of the driving transistor TR1. The driving transistor TR1 may be coupled in series to the organic electroluminescent element 11-2. The driving transistor TR1 may drive the organic electroluminescent element 11-2. The driving transistor TR1 may control an electric current flowing in the organic electroluminescent element 11-2 on the basis of the magnitude of the voltage sampled at the switching transistor TR2. The storage capacitor CS may hold a predetermined voltage between the gate and source of the driving transistor TR1. The storage capacitor CS may hold a gate-source voltage Vgs of the driving transistor TR1 at a constant level for a predetermined period of time. Note that the pixel circuit 11-1 may have the 2TR1C circuit configuration described above and additional capacitors and transistors. Alternatively, the pixel circuit 11-1 may have a circuit configuration different from the 2TR1C circuit configuration described above.

Each of the signal lines DTL may be coupled to the output terminal of the horizontal selector 31 described below and a source or drain of the switching transistor TR2. Each of the scanning lines WSL may be coupled to the output terminal of the write scanner 32 described below and a gate of the switching transistor TR2. Each of the power lines DSL may be coupled to a power supply circuit and the source or drain of the driving transistor TR1.

The gate of the switching transistor TR2 may be coupled to the scanning line WSL. One of the source and drain of the switching transistor TR2 may be coupled to the signal line DTL. The other of the source and drain of the switching transistor TR2 that is uncoupled to the signal line DTL may be coupled to the gate of the driving transistor TR1. One of the source and drain of the driving transistor TR1 may be coupled to the power line DSL. The other of the source and drain of the driving transistor TR1 that is uncoupled to the power line DSL may be coupled to an anode (i.e., an electrode layer 54) of the organic electroluminescent element 11-2. One of terminals of the storage capacitor CS may be coupled to the gate of the driving transistor TR1. The other terminal of the storage capacitor CS may be coupled to one of the source and drain of the driving transistor TR1 that is adjacent to the organic electroluminescent element 11-2.

Each of the driving transistor TR1 and the switching transistor TR2 may be a general thin-film transistor (TFT) that has, for example but not limited to, an inversely staggered structure (i.e., so-called bottom-gate structure) or a staggered structure (i.e., so-called top-gate structure).

[Driver 30]

The driver 30 may include, for example, the horizontal selector 31 and the write scanner 32. The horizontal selector 31 may apply the analog signal voltage Vsig received from the controller 20 to each of the signal lines DTL in response to (in synchronization with) a control signal. The write scanner 32 may scan the pixels P on a predetermined unit basis.

[Controller 20]

The controller 20 will now be described. The controller 20 may perform a predetermined correction of an external digital image signal Din, and generate a signal voltage Vsig on the basis of the corrected image signal, for example. The controller 20 may output the generated signal voltage Vsig to the horizontal selector 31. For example, the controller 20 may output a control signal to each circuit in the driver 30 in response to (in synchronization with) a control signal obtained from the image signal Din.

An example cross-sectional configuration of the organic electroluminescent panel 10A will now be described with reference to FIG. 12. FIG. 12 illustrates the example cross-sectional configuration of the organic electroluminescent panel 10A.

The organic electroluminescent panel 10A may include the plurality of pixels P arranged in matrix. As described above, the pixels P of the organic electroluminescent panel 10A may include the pixels PR, PG, and PB, and the combination of the pixel PR, the pixel PG, and the pixel PB may serve as the display pixel DP. Each display pixel DP may further include the pixel P that emits light of another color, such as white or yellow, as described above. Alternatively, each display pixel DP may include the plurality of pixels P that emit light of the same color. For example, the display pixel DP may include two pixels P that emit blue light.

The pixel PR may include an organic electroluminescent element 11-2 (Pr) that emits red light. The pixel PG may include an organic electroluminescent element 11-2 (Pg) that emits green light. The pixel PB may include an organic electroluminescent element 11-2 (Pb) that emits blue light. The pixels PR, PG, and PB may be arranged by color in stripe pattern along the row direction. Pixel rows each including the pixels emitting light of the same color may be arranged along the column direction.

The organic electroluminescent panel 10A may include a thin-film transistor (TFT) substrate 53. The TFT substrate 53 is described in detail below. The organic electroluminescent panel 10A may include the pixels P on the TFT substrate 53. The organic electroluminescent panel 10A may include the organic electroluminescent element 11-2A for each pixel P on the TFT substrate 53. The organic electroluminescent panel 10A may further include banks 57 that partition the pixels P. The banks 57 may include, for example, an insulating resin material and surround each of the pixels P. The banks 57 may be pixel banks or line banks. The organic electroluminescent panel 10A may further include a sealing layer 58 that protects and seals the pixels P. The sealing layer 58 may include, for example, a resin material, such as an epoxy resin or a vinyl resin.

The organic electroluminescent element 11-2 may include, for example, an electrode layer 54, an organic layer 55, and electrode layer 56 that are stacked in this order from the TFT substrate 53. The organic layer 55 may include, for example, a hole injection layer, a hole transport layer, a light-emitting layer, an electron transport layer, and an electron injection layer that are stacked in this order from the TFT substrate 53. The hole injection layer may enhance efficiency in injecting holes. The hole transport layer may transfer, to the light-emitting layer, holes injected from the electrode layer 54. The light-emitting layer may emit light of a predetermined color through recombination of an electron and a hole. The electron transport layer may transfer, to the light-emitting layer, electrons injected from the electrode layer 56. The electron injection layer may enhance efficiency in injecting electrons.

The electrode layer 54 may be provided on the TFT substrate 53, for example. In one example, the electrode layer 54 may be a reflective electrode having reflectivity. The reflective electrode may include, for example, aluminum (Al), silver (Ag), an aluminum alloy, or a silver alloy. Note that the electrode layer 54 is not limited to the reflective electrode. In another example, the electrode layer 54 may be a transparent electrode having transparency. The transparent electrode may include, for example, a transparent electrically-conductive material, such as indium tin oxide (ITO) or indium zinc oxide (IZO). In still another example, the electrode layer 54 may be a laminate of the reflective electrode and the transparent electrode.

In one example, the electrode layer 56 may be a transparent electrode that includes ITO, for example. Note that the electrode layer 56 is not limited to the transparent electrode. In another example, the electrode layer 56 may be a reflective electrode having light reflectivity. The reflective electrode may include, for example, aluminum (Al), magnesium (Mg), silver (Ag), an aluminum-lithium alloy, or a magnesium-silver alloy. In a case where the TFT substrate 53 and the electrode layer 54 have reflectivity and the electrode layer 56 have transparency, the organic electroluminescent element 11-2 may have a top-emission structure that emits light through the electrode layer 56. In a case where the TFT substrate 53 and the electrode layer 54 have transparency and the electrode layer 56 has reflectivity, the organic electroluminescent element 11-2 may have a bottom-emission structure that emits light through the TFT substrate 53.

Figure 13:
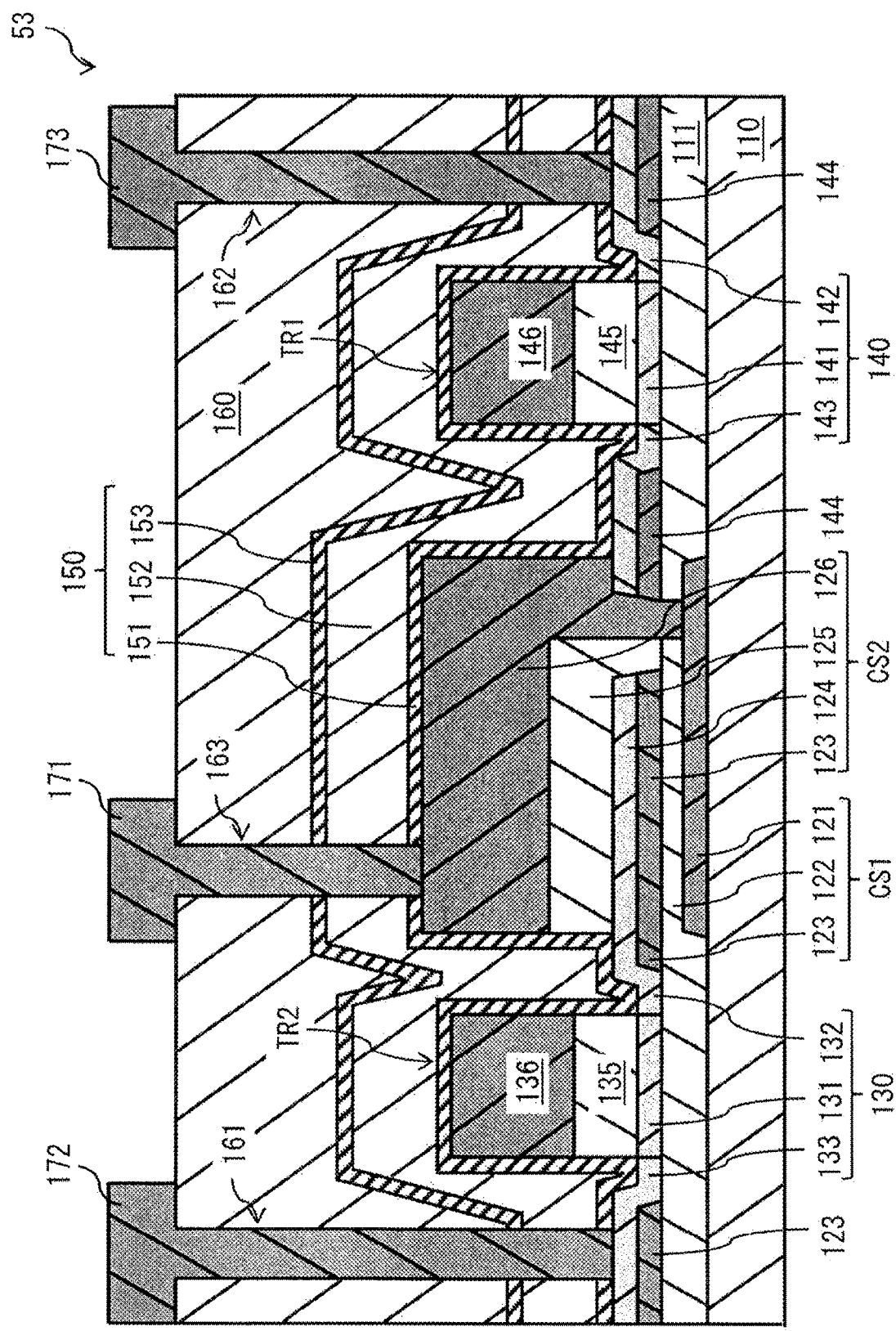
FIG. 13 is an example cross-sectional view of a thin-film transistor substrate illustrated in FIG. 12.

The TFT substrate 53 will now be described with reference to FIG. 13. FIG. 13 illustrates an example cross-sectional configuration of the TFT substrate 53.

The TFT substrate 53 may include, on the base 110, the driving transistor TR1, the switching transistor TR2, and storage capacitors CS1 and CS2, for example. The storage capacitors CS1 and CS2 may be coupled in parallel to each other. The storage capacitors CS1 and CS2 that are coupled in parallel to each other may correspond to the storage capacitor CS described above. The driving transistor TR1, the switching transistor TR2, and the storage capacitors CS1 and CS2 may together serve as the pixel circuit 11-1.

The semiconductor device 1 according to the first embodiment described above may be applied to the TFT substrate 53. In this case, the lower electrode 13 of the semiconductor device 1 may extend to the second region 10-2 and the first region 10-1, for example. The semiconductor auxiliary layer 22 may be thereby opposed to the lower electrode 13 across the first insulating film 14. Accordingly, the semiconductor auxiliary layer 22, the first insulating film 14, and the lower electrode 13 may serve as the storage capacitor CS1.

The base 110 may include, for example, an electrically-insulating material. For example, the base 110 may include a glass material, such as non-alkali glass, quartz glass, or a high heat resistance glass, or a resin material, such as polyethylene, polypropylene, or polyimide. Alternatively, the base 110 may be a flexible base that includes a flexible sheet or film, for example. For example, the base 110 may be a flexible resin base having a single-layer structure or multi-layer structure that includes one or more materials including polyimide, polyethylene terephthalate, and polyethylene naphthalate. An under-coat layer may be provided on a surface of the base 110. The under-coat layer may suppress infiltration of impurities, such as sodium (Na) and phosphorus (P), that are contained in the base 110, or moisture in the atmosphere, into an oxide semiconductor layer 130.

The switching transistor TR2 may include, for example, the oxide semiconductor layer 130, a gate insulating film 135, a gate electrode 136, and a semiconductor auxiliary layer 123.

The oxide semiconductor layer 130 may be a channel layer of the switching transistor TR2. The oxide semiconductor layer 130 may be opposed to the gate electrode 136 across the gate insulating film 135. In the example embodiment, the oxide semiconductor layer 130 may be provided on a CS insulating film 111.

The oxide semiconductor layer 130 may include a channel region 131, a source region 132, and a drain region 133. The channel region 131 may be opposed to the gate electrode 136 across the gate insulating film 135. The source region 132 and the drain region 133 may be provided adjacent to respective sides of the channel region 131. The source region 132 and the drain region 133 may be low-resistance regions having resistance lower than that of the channel region 131. The source region 132 and the drain region 133 may be formed by causing oxygen deficiency in predetermined regions of the oxide semiconductor layer 130 after the formation of the oxide semiconductor layer 130. The oxygen deficiency may be caused by a plasma treatment using argon (Ar) or hydrogen (H) gas, for example.

The oxide semiconductor layer 130 may mainly, but not necessarily mainly, include a transparent amorphous oxide semiconductor (TAOS). For example, the oxide semiconductor layer 130 may mainly, but not necessarily mainly, include an oxide of metal, such as indium (In), gallium (Ga), or zinc (Zn). Specific but non-limiting examples of the material of the oxide semiconductor layer 130 may include InGaZnO, InTiZnO, ZnO, InGaO, and InZnO. For the oxide semiconductor layer 130 that includes InGaZnO, an example element composition of the oxide semiconductor layer 130 may be InGaZnOx. The oxide semiconductor layer 130 may have a thickness within a range from about 10 nm to about 300 nm, for example.

The gate insulating film 135 may include, for example, silicon oxide. The gate electrode 136 may have a single-layer or multi-layer structure that includes an electrically-conductive material, such as metal or metal alloy. Specific but non-limiting examples of the material of the gate electrode 136 may include aluminum (Al), molybdenum (Mo), tungsten (W), molybdenum tungsten (MoW), copper (Cu), titanium (Ti), and chromium (Cr). The gate electrode 136 may have a thickness within a range from about 50 nm to about 300 nm, for example.

The semiconductor auxiliary layer 123 assists electrical coupling between the switching transistor TR2 and the storage capacitor CS via the source region 132, and electrical coupling between the switching transistor TR2 and a drain electrode 172 (described below) via the drain region 133. In one example, the semiconductor auxiliary layer 123 may supply carriers to the source region 132 and the drain region 133. In other words, the semiconductor auxiliary layer 123 may have the carrier-supplying property. This enhances the electrical conductivity of the source region 132 and the drain region 133. In another example, the semiconductor auxiliary layer 123 may have electrical conductivity. This allows the source region 132 and drain region 133 to serve as a conductor, causing an electric current to flow through the semiconductor auxiliary layer 123.

The semiconductor auxiliary layer 123 may include, for example, metal or an oxide semiconductor processed to have a low resistance. In one example, the semiconductor auxiliary layer 123 may include an aluminum-silicon alloy (AlSi), aluminum (Al), IZO, or ITO. For the semiconductor auxiliary layer 123 that includes the oxide semiconductor material, the oxide semiconductor material may include a material different from the oxide semiconductor materials of the source region 132 and the drain region 133, or may have a different composition from the oxide semiconductor materials of the source region 132 and the drain region 133. The semiconductor auxiliary layer 123 that includes such a wet-etchable material helps to suppress an influence to be imposed on the source region 132 and the drain region 133 during the formation of the semiconductor auxiliary layer 123. The semiconductor auxiliary layer 123 may have a thickness within a range from about 5 nm to about 25 nm, for example. Such a semiconductor auxiliary layer 123 having the carrier-supplying property and electrical conductivity maintains the electrical coupling via the source region 132 and the drain region 133 even if the diffusion or infiltration of the carriers from the channel region 131 to the source region 132 and the drain region 133 is insufficient.

The semiconductor auxiliary layer 123 may be provided between the CS insulating film 111 and the source region 132 and between the CS insulating film 111 and the drain region 133, and is in contact with lower surfaces, adjacent to the base 110, of the source region 132 and the drain region 133, for example. In one example, the semiconductor auxiliary layer 123 may extend beyond the channel region 131; for example, the semiconductor auxiliary layer 123 may extend beyond the channel region 131 to the regions adjacent to the respective sides of the channel region 131. In another example, the semiconductor auxiliary layer 123 may extend over a larger region; for example, the semiconductor auxiliary layer 123 may be in contact with the entire lower surfaces of the source region 132 and the drain region 133.

The switching transistor TR2 may be coupled to lead-out electrodes that are respectively coupled to the signal line DTL and the scanning line WSL. One of the lead-out electrodes coupled to the scanning line WSL (i.e., an unillustrated gate electrode) may be electrically conductive with the gate electrode 136 through an unillustrated contact hole. Another lead-out electrode coupled to the signal line DTL (i.e., the drain electrode 172) may be electrically conductive with the drain region 133 through the contact hole 161. The unillustrated gate electrode and the drain electrode 172 may have a single-layer or multi-layer structure that includes an electrically-conductive material, such as metal or metal alloy. Specific but non-limiting examples of the material of the lead-out electrodes that are respectively coupled to the signal line DTL and the scanning line WSL may include aluminum (Al), molybdenum (Mo), tungsten (W), molybdenum tungsten (MoW), copper (Cu), titanium (Ti), and chromium (Cr).

The driving transistor TR1 may include, for example, an oxide semiconductor layer 140, gate insulating films 145 and 146, and a semiconductor auxiliary layer 144.

The oxide semiconductor layer 140 may be a channel layer of the driving transistor TR1. The oxide semiconductor layer 140 may be opposed to the gate electrode 146 across the gate insulating film 145. In the example embodiment, the oxide semiconductor layer 140 may be provided on the CS insulating film 111.

The oxide semiconductor layer 140 may include a channel region 141, a source region 143, and a drain region 142. The channel region 141 may be opposed to the gate electrode 146 across the gate insulating film 145. The source region 143 and the drain region 142 may be provided adjacent to respective sides of the channel region 141. The source region 143 and the drain region 142 may be low-resistance regions having resistance lower than that of the channel region 141. The source region 143 and the drain region 142 may be formed by causing oxygen deficiency in predetermined regions of the oxide semiconductor layer 140 after the formation of the oxide semiconductor layer 140. The oxygen deficiency may be caused by a plasma treatment using argon (Ar) or hydrogen (H) gas, for example.

The oxide semiconductor layer 140 may mainly, but not necessarily mainly, include a transparent amorphous oxide semiconductor (TAOS). For example, the oxide semiconductor layer 140 may mainly, but not necessarily mainly, include an oxide of metal, such as indium (In), gallium (Ga), or zinc (Zn). Specific but non-limiting example of the material of the oxide semiconductor layer 140 may include InGaZnO, InTiZnO, ZnO, InGaO, and InZnO. For the oxide semiconductor layer 140 that includes InGaZnO, an example element composition of the oxide semiconductor layer 140 may be InGaZnOx. The oxide semiconductor layer

140 may have a thickness within a range from about 10 nm to about 300 nm, for example.

The gate insulating film 145 may include, for example, silicon oxide. The gate electrode 146 may have a single-layer or multi-layer structure that includes an electrically-conductive material, such as metal or metal alloy. Specific but non-limiting examples of the material of the gate electrode 146 may include aluminum (Al), molybdenum (Mo), tungsten (W), molybdenum tungsten (MoW), copper (Cu), titanium (Ti), and chromium (Cr). The gate electrode 146 may have a thickness within a range from about 50 nm to about 300 nm, for example.

The semiconductor auxiliary layer 144 assists electrical coupling between the driving transistor TR1 and the storage capacitor CS via the source region 143, and electrical coupling between the driving transistor TR1 and the drain electrode 173 (described below) via the drain region 142. In one example, the semiconductor auxiliary layer 144 may supply carriers to the source region 143 and the drain region 142. In other words, the semiconductor auxiliary layer 144 may have the carrier-supplying property. This enhances the electrical conductivity of the source region 143 and the drain region 142. In another example, the semiconductor auxiliary layer 144 may have electrical conductivity. This allows the source region 143 and the drain region 142 to serve as a conductor, causing an electric current to flow through the semiconductor auxiliary layer 144.

The semiconductor auxiliary layer 144 may include, for example, metal or an oxide semiconductor processed to have a low resistance. In one example, the semiconductor auxiliary layer 144 may include an aluminum-silicon alloy (AlSi), aluminum (Al), IZO, or ITO, for example. For the semiconductor auxiliary layer 144 that includes the oxide semiconductor material, the oxide semiconductor material may include a material different from the oxide semiconductor materials of the source region 143 and the drain region 142, or may have a different composition from the oxide semiconductor materials of the source region 143 and the drain region 142. The semiconductor auxiliary layer 144 that includes such a wet-etchable material helps to suppress an influence to be imposed on the source region 143 and the drain region 142 during the formation of the semiconductor auxiliary layer 144. The semiconductor auxiliary layer 144 may have a thickness within a range from about 5 nm to about 25 nm, for example. Such a semiconductor auxiliary layer 144 having the carrier-supplying property and electrical conductivity maintains the electrical coupling via the source region 143 and the drain region 142 even if the diffusion or infiltration of the carriers from the channel region 141 to the source region 143 and the drain region 142 is insufficient.

The semiconductor auxiliary layer 144 may be provided between the CS insulating film 111 and the source region 143 and between the CS insulating film 111 and the drain region 142, and is in contact with lower surfaces, adjacent to the base 110, of the source region 143 and the drain region 142, for example. In one example, the semiconductor auxiliary layer 144 may extend beyond the channel region 141; for example, the semiconductor auxiliary layer 144 may extend beyond the channel region 141 to the regions adjacent to the respective sides of the channel region 141. In another example, the semiconductor auxiliary layer 144 may extend over a larger region; for example, the semiconductor auxiliary layer 144 may be in contact with the entire lower surfaces of the source region 143 and the drain region 142.

The driving transistor TR1 may be coupled to lead-out electrodes that are respectively coupled to the power line DSL and the organic electroluminescent element 11-2. One of the lead-out electrodes coupled to the power line DSL (i.e., a drain electrode 173) may be electrically conductive with the drain region 142 through a contact hole 162. Another lead-out electrode coupled to the organic electroluminescent element 11-2 (i.e., a source electrode 171) may be electrically conductive with the source region 143 through a contact hole 163 and a CS upper electrode 126. The drain electrode 173 and the source electrode 171 may have a single-layer or multi-layer structure that includes an electrically-conductive material, such as metal or metal alloy. Specific but non-limiting examples of the material of the lead-out electrodes that are respectively coupled the power line DSL and the organic electroluminescent element 11-2 may include aluminum (Al), molybdenum (Mo), tungsten (W), molybdenum tungsten (MoW), copper (Cu), titanium (Ti), and chromium (Cr).

The storage capacitors CS1 and CS2 that are coupled in parallel to each other may together serve as the storage capacitor CS. The storage capacitors CS1 and CS2 may be stacked in this order from the base 110. The storage capacitor CS1 includes a CS lower electrode 121, a CS insulating film 122, and a semiconductor auxiliary layer 123. The CS lower electrode 121 may correspond to a specific but non-limiting example of "first metal layer" according to one embodiment of the technology. The CS insulating film 122 may correspond to a specific but non-limiting example of "first insulating layer" according to one embodiment of the technology. The storage capacitor CS may include the CS lower electrode 121 opposed to the semiconductor auxiliary layer 123 across the CS insulating film 122. The CS lower electrode 121 and the semiconductor auxiliary layer 123 that are opposed to each other across the CS insulating film 122 may serve as the storage capacitor CS1. In other words, the storage capacitor CS may have a laminate that includes the CS lower electrode 121, the CS insulating film 122, and the semiconductor auxiliary layer 123 that are stacked in this order from the base 110, and the laminate may serve as the storage capacitor CS1. The storage capacitor CS2 may include the semiconductor auxiliary layer 123, a source region 124, a CS insulating film 125, and a CS upper electrode 126. The CS upper electrode 126 may correspond to a specific but non-limiting example of "second metal layer" according to one embodiment of the technology. The CS insulating film 125 may correspond to a specific but non-limiting example of "second insulating layer" according to one embodiment of the technology. The storage capacitor CS may further include the CS upper electrode 126 that couples the CS lower electrode 121 and the gate of the driving transistor TR1 (i.e., the gate electrode 146). The semiconductor auxiliary layer 123 and the CS upper electrode 126 that are opposed to each other across the CS insulating film 125 and the source region 124 may serve as the storage capacitor CS2. In other words, the storage capacitor CS may include a laminate that includes the semiconductor auxiliary layer 123, the source region 124, the CS insulating film 125, and the CS upper electrode 126 that are stacked in this order from the base 110, and the laminate may serve as the storage capacitor CS2. The storage capacitor CS2 may be provided on the storage capacitor CS1.

The CS lower electrode 121 may mainly, but not necessarily mainly, include an electrically-conductive material. Specific but non-limiting example of the electrically-conductive material may include titanium (Ti) and aluminum (Al). For example, the electrically-conductive material may include one of metals including molybdenum (Mo), copper (Cu), tungsten (W), manganese (Mn), chromium (Cr), tantalum (Ta), niobium (Nb), silver (Ag), gold (Au), platinum (Pt), palladium (Pd), indium (In), nickel (Ni), and neodymium (Nd), or an alloy of two or more of these metals. For example, the CS lower electrode 121 may include molybdenum tungsten (MoW).

The CS insulating film 122 may be a portion of the CS insulating film 111 that extends over the entire surface of the base 110. The CS insulating film 122 may be provided on the CS lower electrode 121. The CS insulating film 111 and the CS insulating film 122 may be inorganic layers that are provided on the base 110, and may also serve as an under-coat layer, for example. The CS insulating films 111 and 122 also serving as the under-coat layer may suppress infiltration of impurities, such as sodium (Na) and phosphorus (P) that are contained in the base 110, or moisture in the atmosphere, into the oxide semiconductor layers 130 and 140. This stabilizes the qualities of the oxide semiconductor layers 130 and 140, resulting in a stable TFT characteristic. The CS insulating film 111 and the CS insulating film 122 may have a multi-layer structure that includes CS insulating films 111 and 112. For example, the CS insulating film 111 may include silicon nitride (SiNx), and the CS insulating layer 112 may include silicon oxide (SiOx). The CS insulating films 111 and 122 may each have a thickness within a range from about 100 nm to about 1000 nm, for example. The semiconductor auxiliary layer 144 may be provided on the CS insulating film 122.

The source region 132 may be provided on the semiconductor auxiliary layer 144. A portion of the source region 132 in contact with the CS insulating film 125 may be the source region 124. The source region 124 may have a higher resistance than the other portion of the source region 132 not in contact with the CS insulating film 125. The CS insulating film 125 may be an inorganic layer provided on the semiconductor auxiliary layer 123 and the CS insulating film 122. The CS insulating film 125 may be provided between the source region 124 on the semiconductor auxiliary layer 123 and the CS upper electrode 126. The CS insulating film 125 may insulate the semiconductor auxiliary layer 123 and the source region 124 from the CS upper electrode 126. The CS insulating film 125 may include a material common to the materials of the CS insulating films 111 and 122. The CS insulating film 125 may include, for example, silicon nitride (SiNx) or silicon oxide (SiOx). The CS upper electrode 126 may be provided on the CS insulating film 125, the CS lower electrode layer 121, the source region 143, and the semiconductor auxiliary layer 144. The CS upper electrode 126 may be electrically conductive with the CS lower electrode layer 121, the source region 143, and the semiconductor auxiliary layer 144. The CS upper electrode 126 may include a material common to the materials of the gate electrodes 136 and 146.

The TFT substrate 53 may further include an inorganic insulating film 150 and an organic insulating film 160 that cover each of the pixel circuits 11-1, for example. For example, the TFT substrate 53 may be covered with a laminate of the inorganic insulating film 150 and the organic insulating film 160. The inorganic insulating film 150 and the organic insulating film 160 may be provided so as to cover the driving transistor TR1, the switching transistor TR2, and the storage capacitor CS. The inorganic insulating film 150 may be in contact with surfaces of the driving transistor TR1, the switching transistor TR2, and the storage capacitor CS.

The inorganic insulating film 150 may serve as an insulating film that blocks permeation of hydrogen. The inorganic insulating film 150 may have, for example, a three-layer structure that includes a lower inorganic film 151, an intermediate inorganic film 152, and an upper inorganic film 153 that are stacked in this order from the base 110. The inorganic insulating film 150 may be in contact with the surfaces of the driving transistor TR1 and the switching transistor TR2.

The lower inorganic film 151 may serve as a hydrogen suppressing (or blocking) layer that blocks permeation of hydrogen. The lower inorganic film 151 may suppress or block permeation of hydrogen from the intermediate inorganic film 152 to the channel regions 131 and 141. The lower inorganic film 151 may also suppress or block permeation of hydrogen from the base 110 to the intermediate inorganic film 152.

The lower inorganic film 151 may be provided so as to cover surfaces of the gate electrode 136, the source region 132, the drain region 133, the CS upper electrode 126, the source region 143, the gate electrode 146, and the drain region 142. For example, the lower inorganic film 151 may be in contact with the surfaces of the gate electrode 136, the source region 132, the drain region 133, the CS upper electrode 126, the source region 143, the gate electrode 146, and the drain region 142.

The lower inorganic film 151 may be thick enough to draw oxygen from the oxide semiconductor layers 130 and 140. In an example, the lower inorganic film 151 may have a thickness of about 10 nm or greater. In another example, the lower inorganic film 151 may have a thickness of about 20 nm or greater. The lower inorganic film 151 may have a film density of 2.7 g/cm$^3$ or less, for example. The lower inorganic film 151 may include aluminum oxide, for example.

The intermediate inorganic film 152 may be provided so as to cover the lower inorganic film 151. For example, the intermediate inorganic film 152 may cover the entire surface of a device region in which the pixel circuit 11-1 is provided. The intermediate inorganic film 152 may have a thickness of about 200 nm, for example without limitation.

The intermediate inorganic film 152 may mainly, but not necessarily mainly, include an inorganic material. The intermediate inorganic film 152 may be a single-layer or multi-layer film that includes, for example, silicon oxide (SiOx), silicon nitride (SiNx), silicon oxide nitride (SiONx), or aluminum oxide (AlOx). A material having a low relative permittivity may be used to form the intermediate inorganic film 152 having a large thickness. This reduces a parasitic capacitance between the gate electrode 136 and the drain electrode 172 and a parasitic capacitance between the gate electrode 146 and the drain electrode 173.

The upper inorganic film 153 may be one example of the hydrogen suppressing (or blocking) layer that blocks permeation of hydrogen. The upper inorganic film 153 may suppress or block permeation of hydrogen from the organic insulating film 160 to the intermediate inorganic film 152.

The upper inorganic film 153 may be provided so as to cover the intermediate inorganic film 152. For example, the upper inorganic film 153 may cover the entire surface of the device region in which the pixel circuit 11-1 is provided. The upper inorganic film 153 may have a thickness of about 10 nm or greater, for example without limitation. The upper inorganic film 153 may include aluminum oxide, for example.

The organic insulating film 160 may be provided on the inorganic insulating film 150. The organic insulating film 160 may include, for example, an organic material, such as polyimide. The organic insulating film 160 may be a single-layer film or multi-layer film.

A plurality of openings (i.e., the contact holes 161, 162, and 163) may extend through the inorganic insulating film 150 and the organic insulating film 160. The pixel circuit 11-1 may be electrically conductive with the signal line DTL, the scanning line WSL, the power line DSL, and the organic electroluminescent element 11-2 through the contact holes 161, 162, and 163.

[Manufacturing Method]

Figure 14A:
FIG. 14A is a diagram illustrating an example process of manufacturing a thin-film transistor substrate of FIG. 13.
Figure 14B:
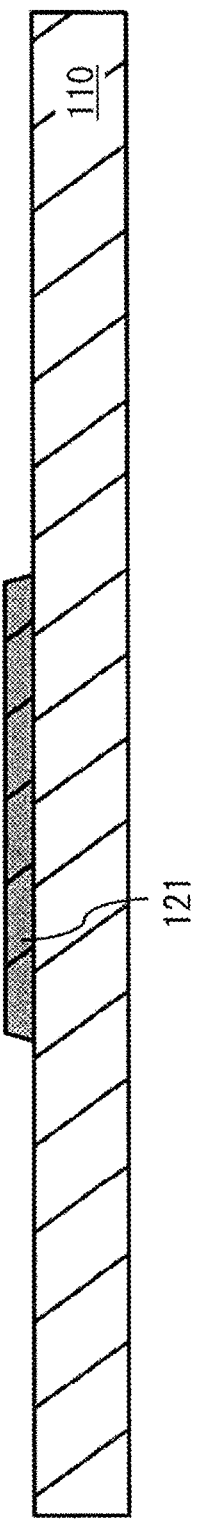
FIG. 14B is a diagram illustrating an example process following the process of FIG. 14A.

A method of manufacturing the TFT substrate 53 according to an example embodiment of the technology will now be described with reference to FIGS. 14A to 14Q. FIG. 14A illustrates a process of preparing the base 110, and FIG. 14Q illustrates a process immediately before the formation of the lead-out electrodes (e.g., the source electrode 171 and the drain electrodes 172 and 173).

Firstly, the base 110 may be prepared, as illustrated in FIG. 14A. Optionally, a surface of the base 110 may be washed. Thereafter, the CS lower electrode 121 may be formed over the entire surface of the base 110 by sputtering, for example. With reference to FIG. 14B, the CS lower electrode 121 may be covered by a mask having a predetermined pattern and thereafter selectively etched by dry-etching. Thereafter, the mask may be removed.

Figure 14C:
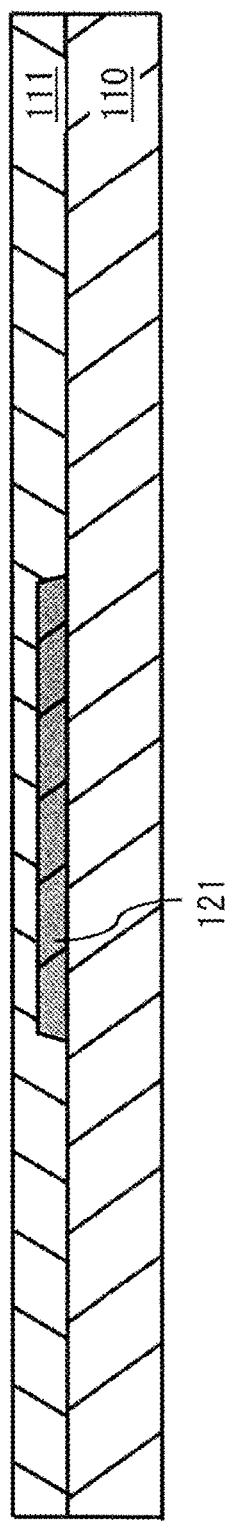
FIG. 14C is a diagram illustrating an example process following the process of FIG. 14B.
Figure 14D:
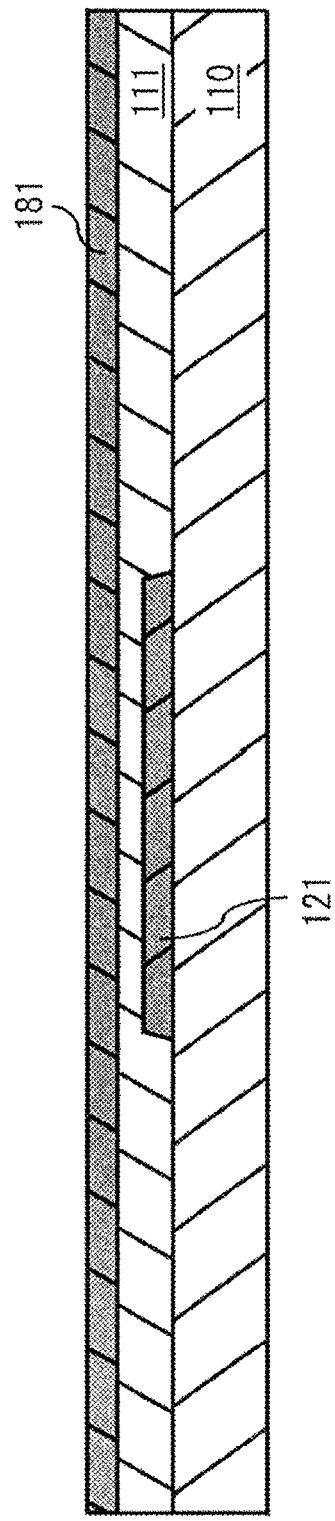
FIG. 14D is a diagram illustrating an example process following the process of FIG. 14C.
Figure 14E:
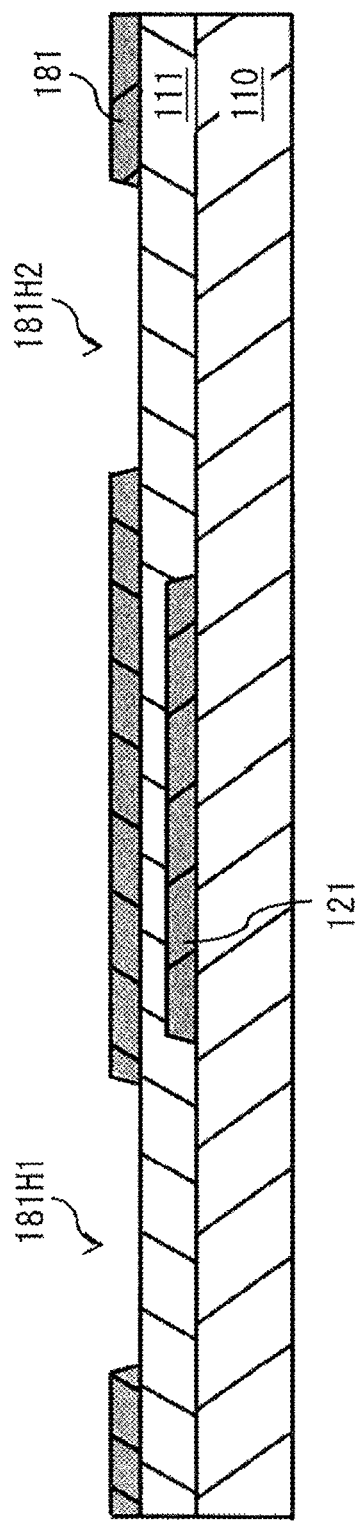
FIG. 14E is a diagram illustrating an example process following the process of FIG. 14D.
Figure 14F:
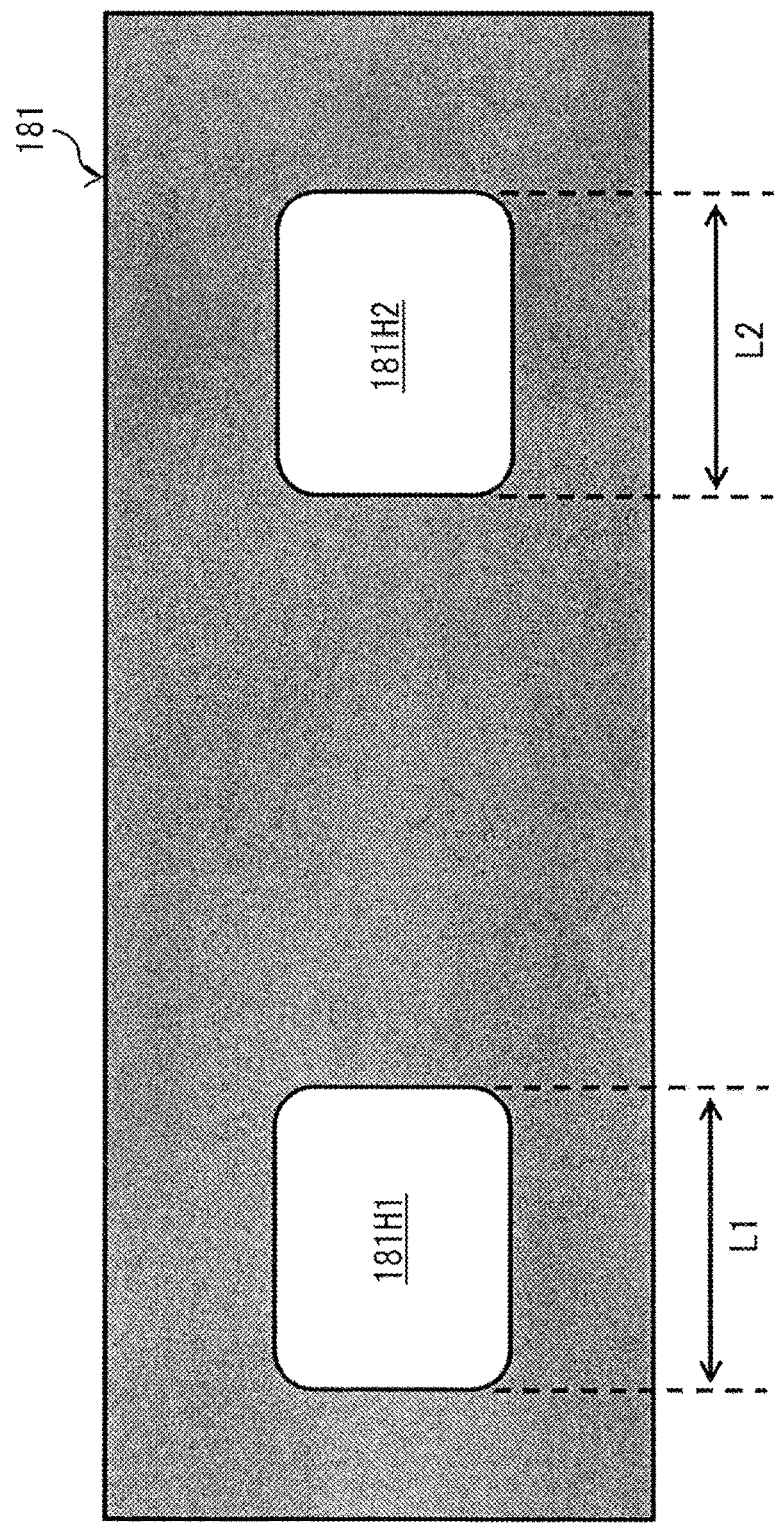
FIG. 14F is a plan view of a semiconductor auxiliary layer of FIG. 14E.

Thereafter, with reference to FIG. 14C, the CS insulating film 111 may be formed over the entire surface of the base 110 that includes the surface of the CS lower electrode 121 by CVD, for example. Thereafter, with reference to FIG. 14D, the semiconductor auxiliary layer 181 may be formed on the CS insulating film 111 by sputtering, for example. The semiconductor auxiliary layer 181 may be processed into the semiconductor auxiliary layers 123 and 144 in a later process. Thereafter, the semiconductor auxiliary layer 181 may be covered by a mask having a predetermined pattern and selectively etched by wet-etching. With reference to FIGS. 14E and 14F, holes 181H1 and 181H2 may be thereby formed in the semiconductor auxiliary layer 181. The channel regions 131 and 141 are to be formed in the respective holes 181H1 and 181H2 in a later process. The hole 181H1 may have a width L1 along a predetermined direction. The width L1 may correspond to the length L of the switching transistor TR2. The hole 181H2 may have a width L2 along the predetermined direction. The width L2 may correspond to the length L of the driving transistor TR1. As described above, the lengths L of the transistors may be precisely defined by patterning. Thereafter, the mask may be removed.

Figure 14G:
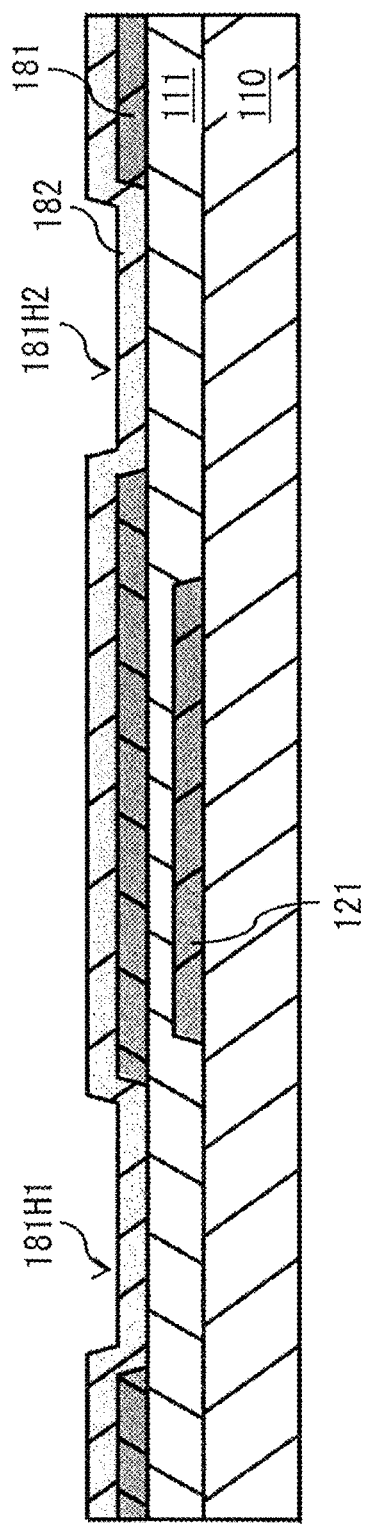
FIG. 14G is a diagram illustrating an example process following the process of FIG. 14E.
Figure 14H:
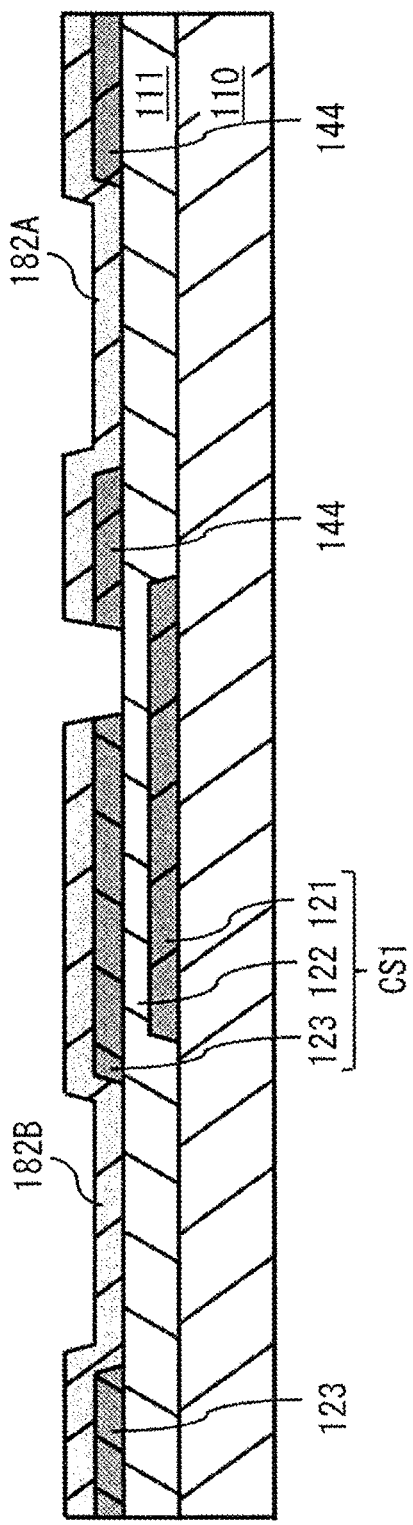
FIG. 14H is a diagram illustrating an example process following the process of FIG. 14G.
Figure 14I:
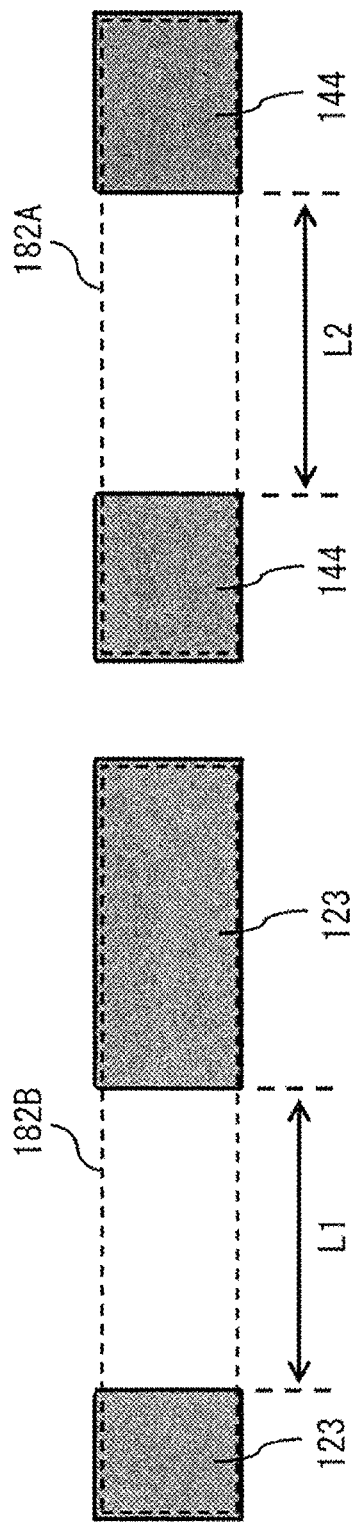
FIG. 14I is a plan view of a semiconductor auxiliary layer and an oxide semiconductor layer that are illustrated in FIG. 14H.

Thereafter, with reference to FIG. 14G, an oxide semiconductor layer 182 may be formed over the entire surface of the semiconductor auxiliary layer 181 by sputtering, for example. The oxide semiconductor layer 182 may be processed into the oxide semiconductor layers 130 and 140 in a later process. Thereafter, the oxide semiconductor layer 182 may be covered by a mask having a predetermined pattern, and the oxide semiconductor layer 182 and the semiconductor auxiliary layer 181 may be selectively etched by wet-etching. Thereafter, the mask may be removed, and annealing may be performed. Two semiconductor auxiliary layers 123 and two semiconductor auxiliary layers 144 may be thereby formed, as illustrated in FIGS. 14H and 14I. The two semiconductor auxiliary layers 123 may face each other at their sides across a gap having a width L1. The two semiconductor auxiliary layers 144 may face each other at their sides across a gap having a width L2. Thereafter, an oxide semiconductor layer 182A may be formed so as to bridge across the two semiconductor auxiliary layers 123, and an oxide semiconductor layer 182B may be formed so as to bridge across the two semiconductor auxiliary layers 144, as illustrated in FIGS. 14H and 14I. In this example embodiment, a laminate of the CS lower electrode 121, the CS insulating film 122, and the semiconductor auxiliary layer 123 may serve as the storage capacitor CS1.

Figure 14J:
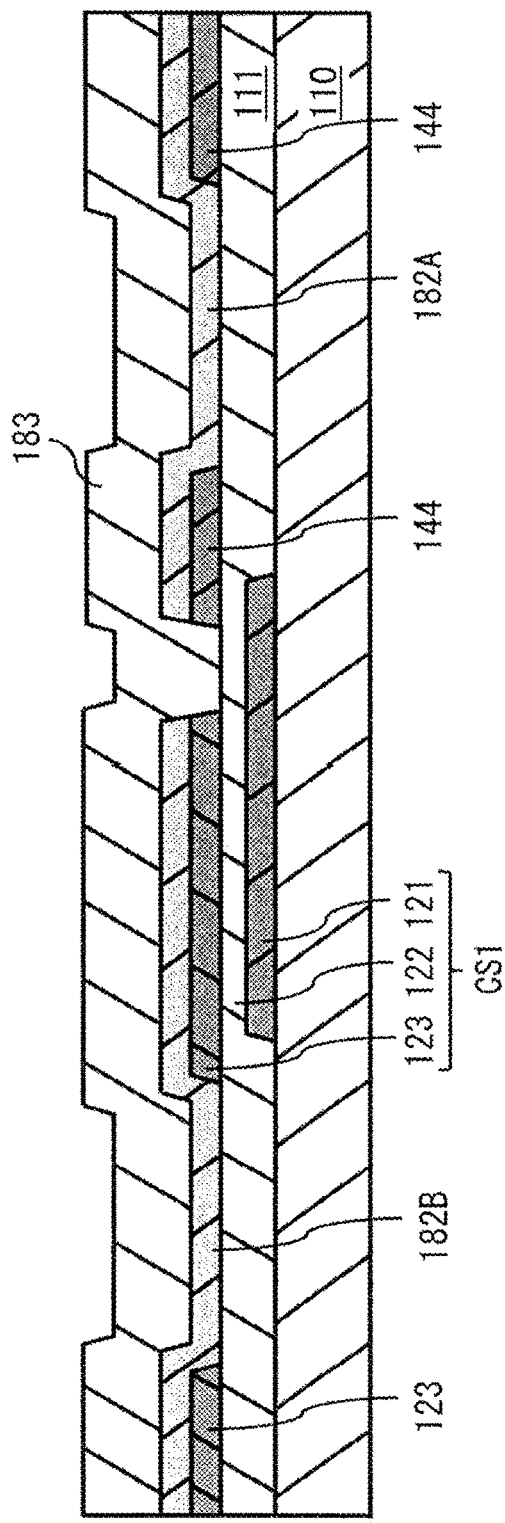
FIG. 14J is a diagram illustrating an example process following the process of FIG. 14H.
Figure 14K:
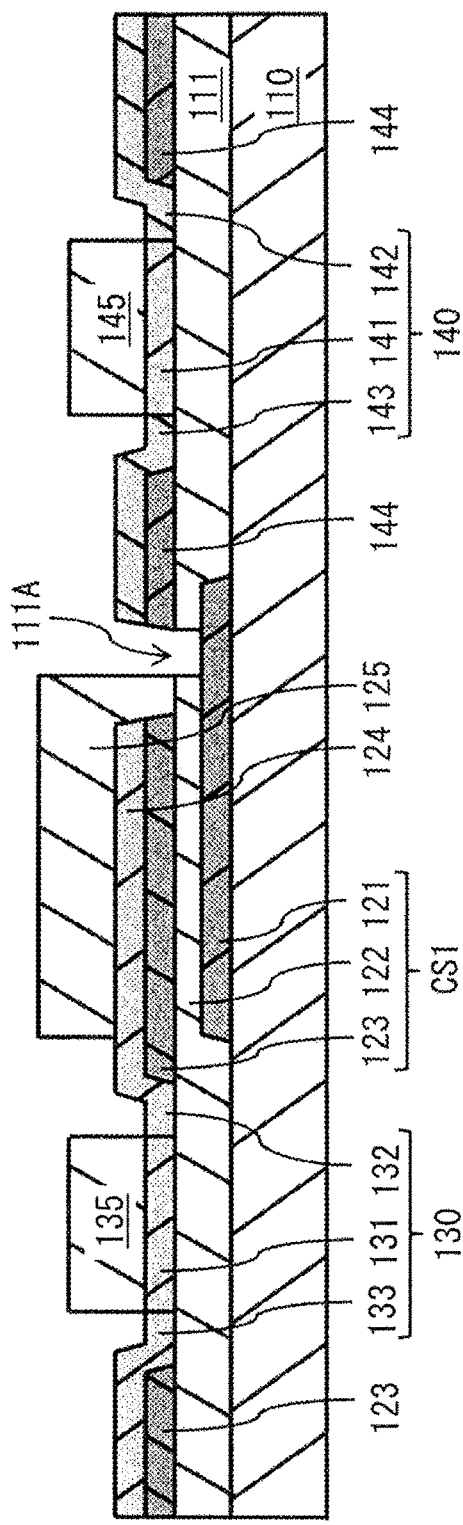
FIG. 14K is a diagram illustrating an example process following the process of FIG. 14J.

Thereafter, with reference to FIG. 14J, a gate insulating film 183 may be formed over the entire surface that includes surfaces of the oxide semiconductor layers 182A and 182B by CVD, for example. The gate insulating film 183 may be processed into the gate insulating films 135 and 136 in a later process. Thereafter, the gate insulating film 183 may be covered by a mask having a predetermined pattern, and selectively etched by dry-etching. The gate insulating films 135 and 145 may be thereby formed on the oxide semiconductor layer 182A and the oxide semiconductor layer 182B, respectively, as illustrated in FIG. 14K. As a result, the oxide semiconductor layers 130 and 140 may be formed.

During the dry-etching, a selective portion of the CS insulating film 111 (i.e., a selective portion of the CS insulating film 122) opposed to the CS lower electrode 121 may be removed to thereby form an aperture 111A in the CS insulating film 122. The CS lower electrode 121 may be exposed at the bottom of the aperture 111A. Thereafter, the CS insulating film 125 may be formed so as to cover a portion of the semiconductor auxiliary layer 123 and a portion of the source region 132 that are adjacent to the aperture 111A, as illustrated in FIG. 14K. Thereafter, the mask may be removed.

Figure 14L:
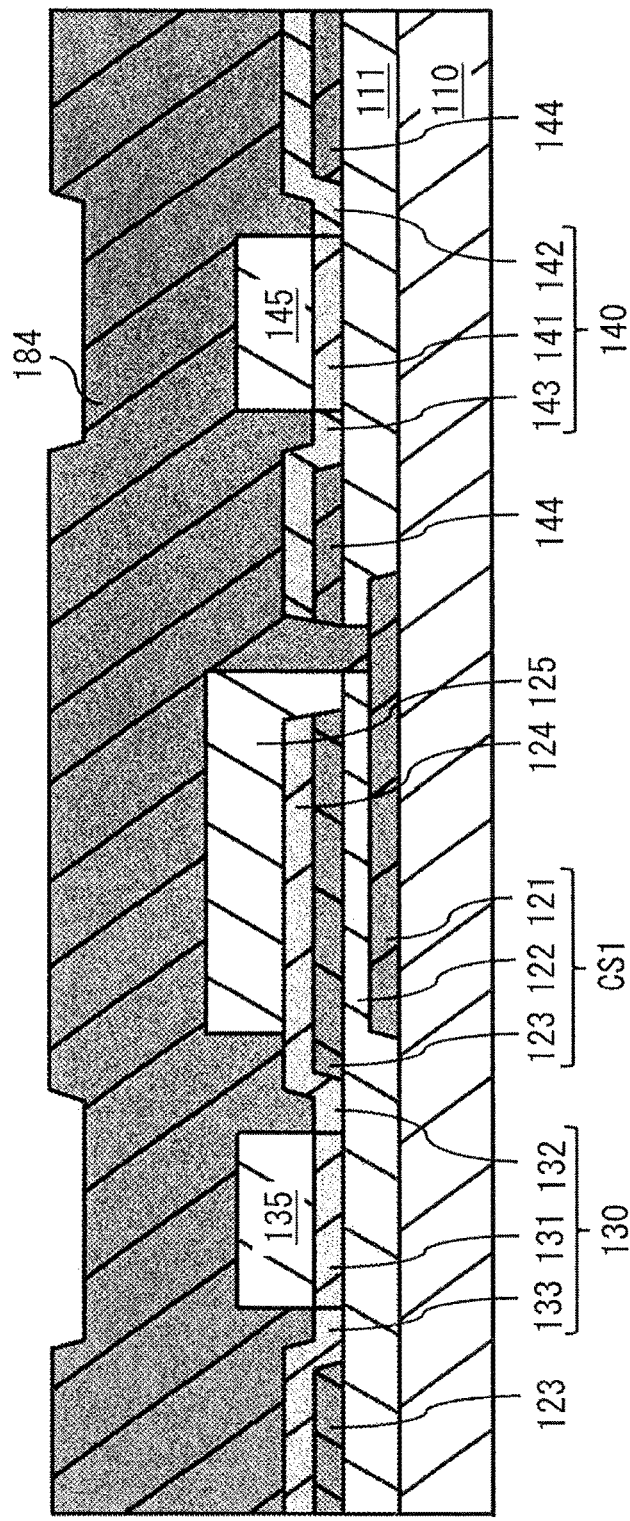
FIG. 14L is a diagram illustrating an example process following the process of FIG. 14K.
Figure 14M:
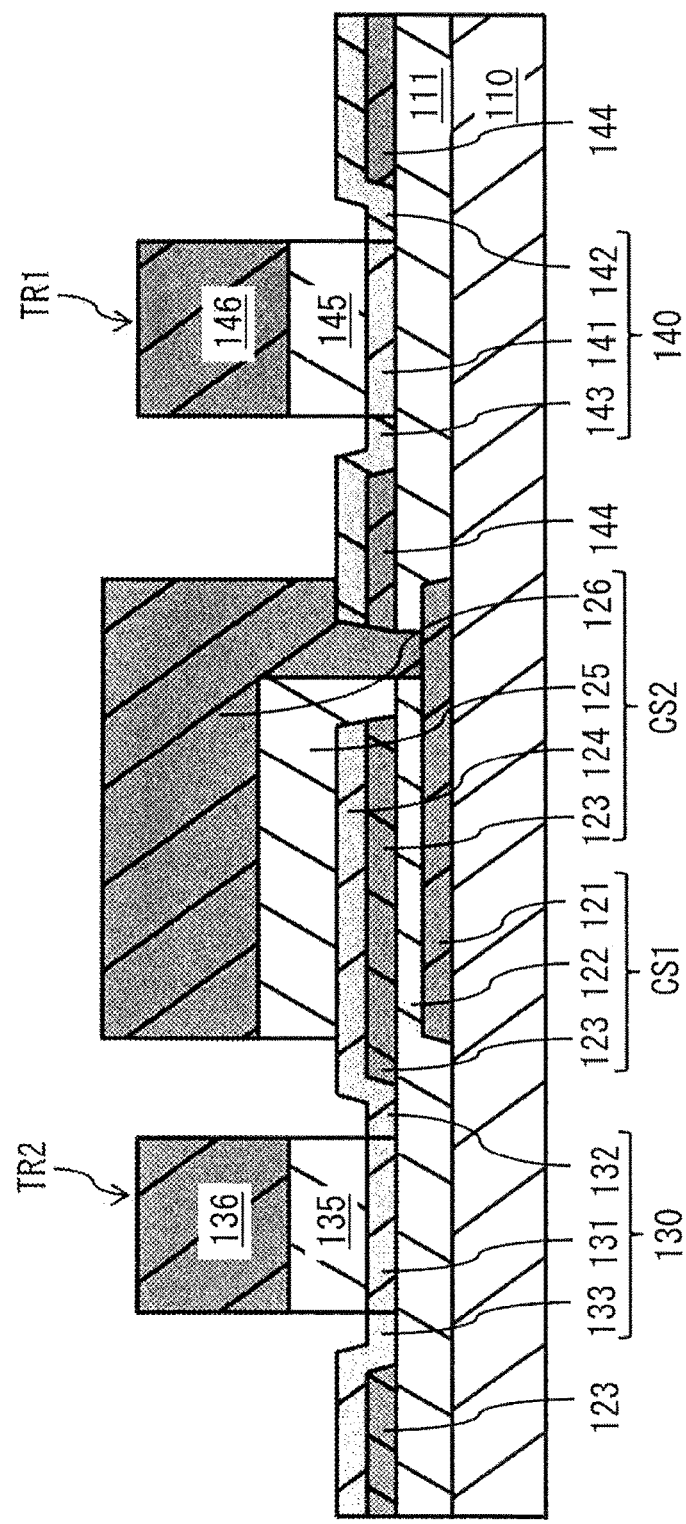
FIG. 14M is a diagram illustrating an example process following the process of FIG. 14L.

Thereafter, with reference to FIG. 14L, a gate electrode 184 may be formed over the entire surface that includes surfaces of the gate insulating films 134 and 145 and the CS insulating film 125 by sputtering, for example. The gate electrode 184 may be processed into the gate electrodes 136 and 146 and the CS upper electrode 126 in a later process. Thereafter, the gate electrode 184 may be covered by a mask having a predetermined pattern, and selectively etched by dry-etching. The driving transistor TR1, the switching transistor TR2, and the storage capacitor CS2 may be thereby formed, as illustrated in FIG. 14M. Thereafter, the mask may be removed.

Figure 14N:
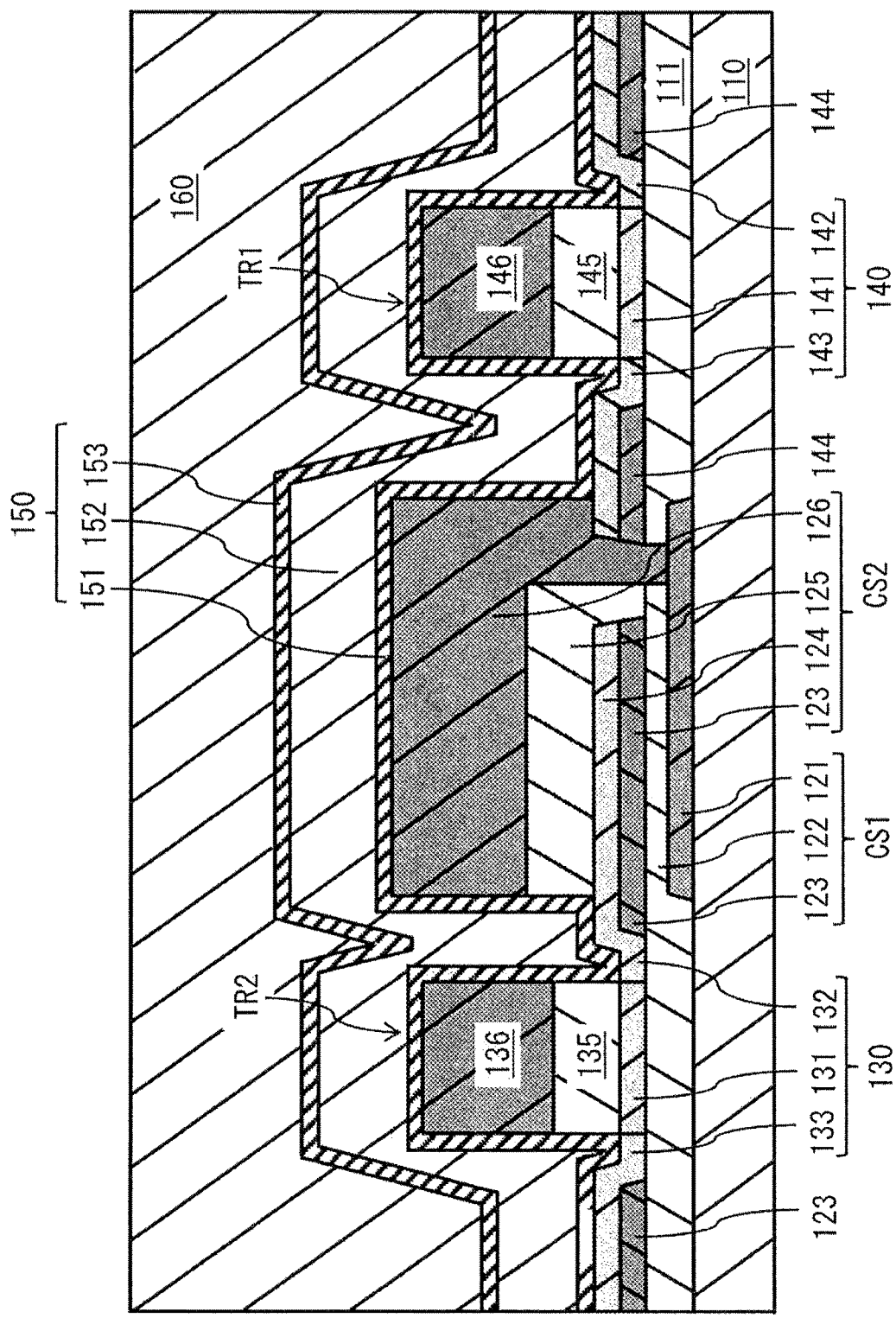
FIG. 14N is a diagram illustrating an example process following the process of FIG. 14M.

Thereafter, with reference to FIG. 14N, the lower inorganic film 151 may be formed by sputtering, for example, followed by forming the intermediate inorganic film 152 by CVD, for example, and forming the upper inorganic film 153 by sputtering, for example. The inorganic insulating film 150 may be thereby formed. The lower inorganic film 151 may keep the oxide semiconductor layer at a low resistance. Therefore, the source region 132 in contact with the lower inorganic film 151 may be kept at a low resistance, whereas the source region 124 not in contact with the lower inorganic film 151 but in contact with the CS insulating film 125 may have a high resistance and may not serve as a wiring line. Thereafter, the organic insulating film 160 may be formed by coating, for example, and annealing may be performed to solidify the organic insulating film 160, as illustrated in FIG. 14N.

Figure 14P:
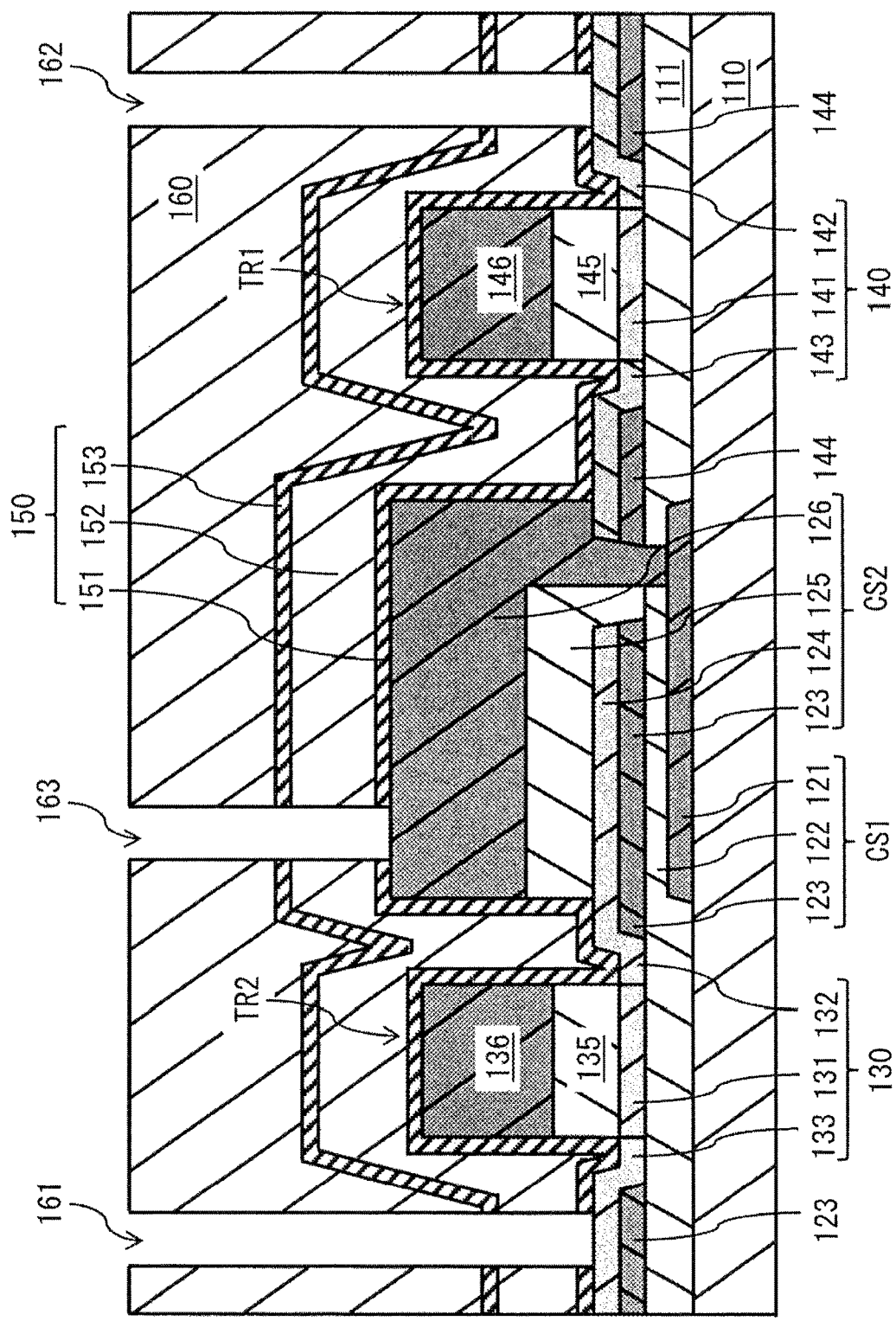
FIG. 14P is a diagram illustrating an example process following the process of FIG. 14N.
Figure 14Q:
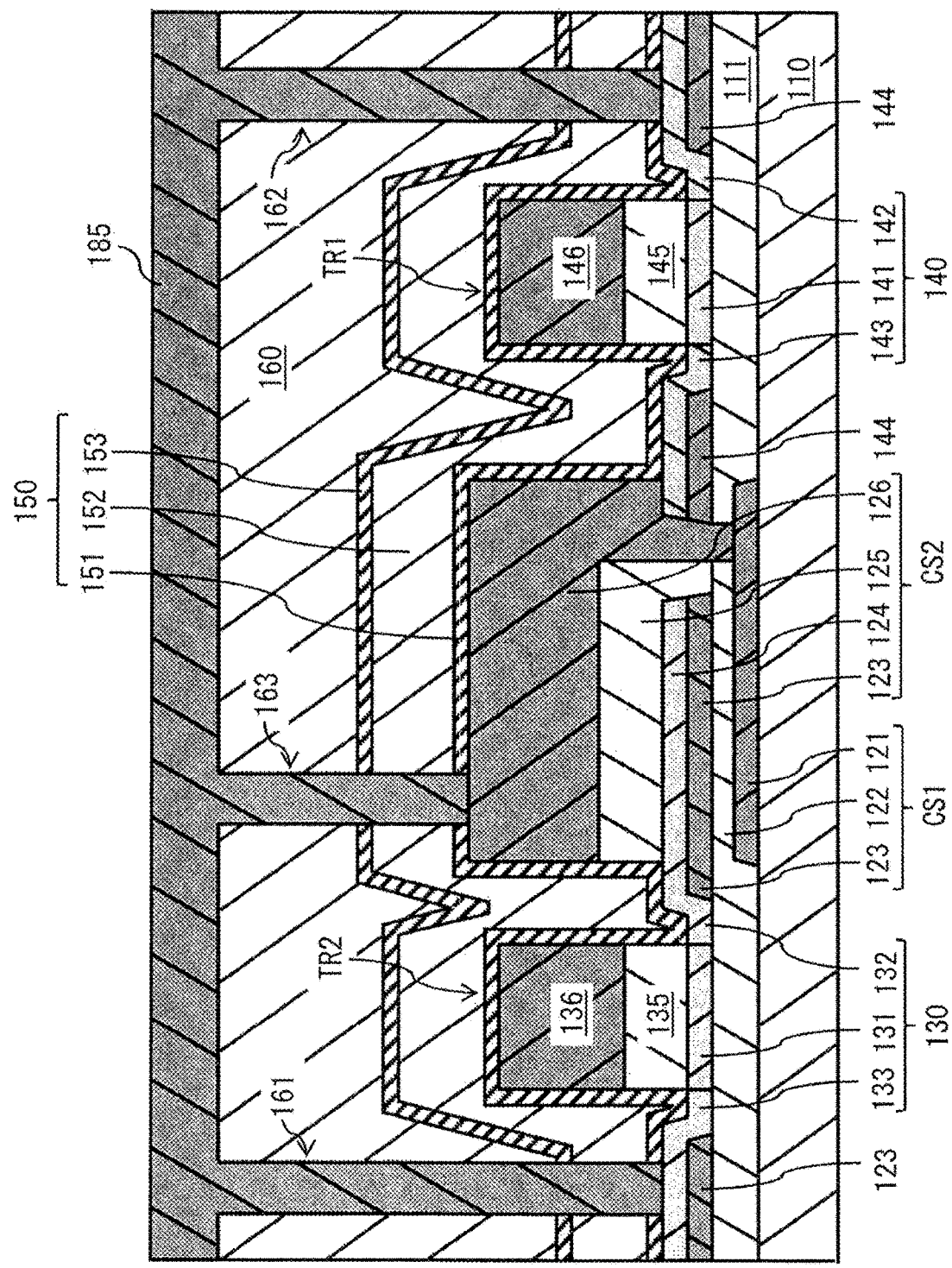
FIG. 14Q is a diagram illustrating an example process following the process of FIG. 14P.

Thereafter, the organic insulating film 160 may be covered by a mask having a predetermined pattern, and the organic insulating film 160 and the inorganic insulating film 150 may be selectively etched by dry-etching, for example. With reference to FIG. 14P, the contact holes 161, 162, and 163 may be formed that extend through the organic insulating film 160 and the inorganic insulating film 150. Thereafter, the mask may be removed. Thereafter, with reference to FIG. 14Q, an electrode layer 185 may be formed over the entire surface of the organic insulating film 160 having the contact holes 161, 162, and 163 by sputtering, for example.

The electrode layer 185 may be processed into the lead-out electrodes (i.e., the source electrode 171 and the drain electrodes 172 and 173) in a later process. Thereafter, the electrode layer 185 may be covered by a mask having a predetermined pattern, and selectively etched by dry-etching, followed by annealing. The lead-out electrodes (i.e., the source electrode 171 and the drain electrodes 172 and 173) may be thereby formed, as illustrated in FIG. 13. Through these processes described above, the TFT substrate 53 may be manufactured.

[Example Effects]

Some example effects of the TFT substrate 53 according to an example embodiment of the technology and the organic electroluminescent unit 1A that includes the TFT substrate 53 will now be described in comparison with a comparative example.

Figure 15:
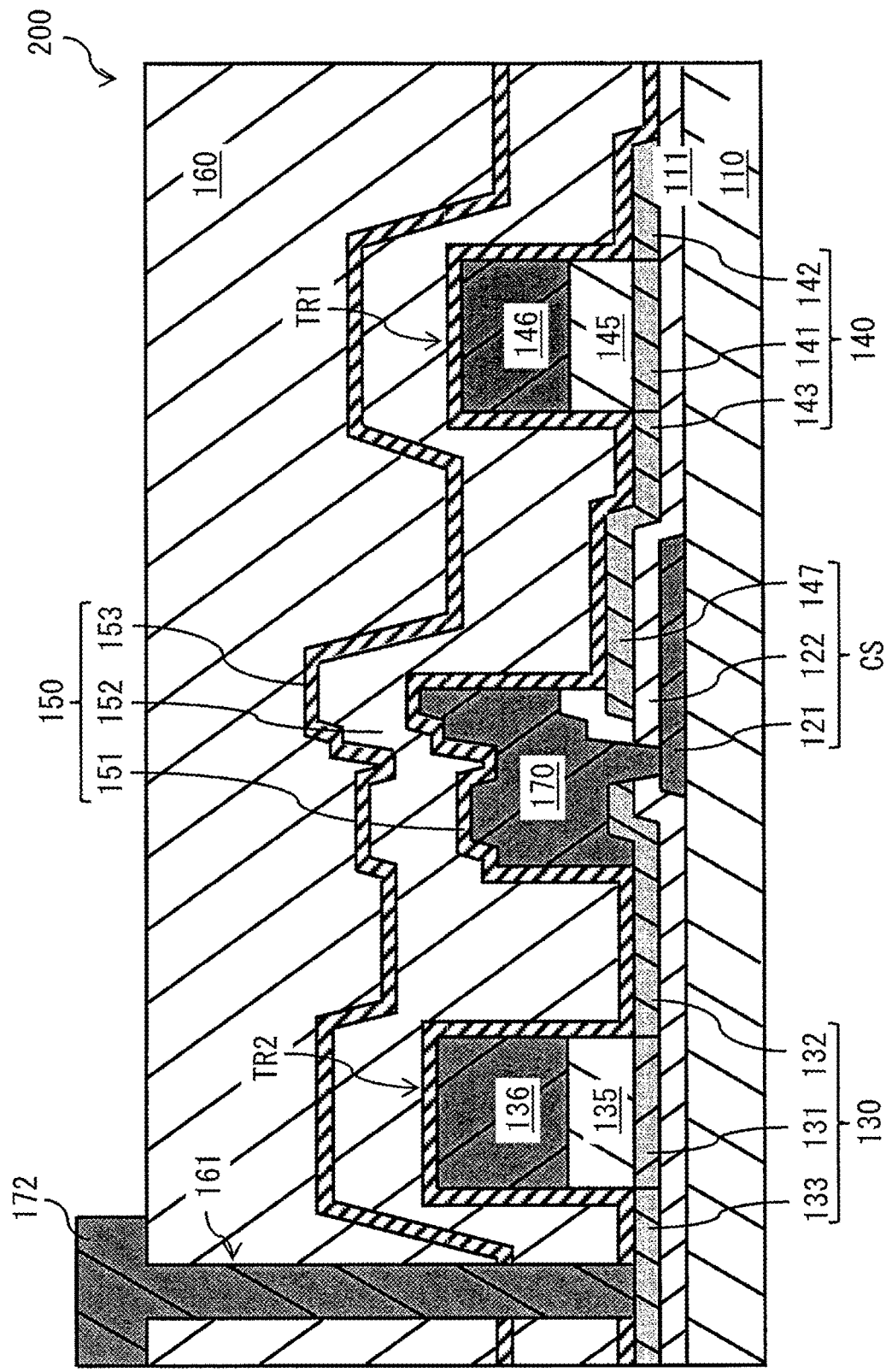
FIG. 15 is a cross-sectional view of a thin-film transistor substrate according to Comparative Example 2.

FIG. 15 illustrates a cross-sectional configuration of a TFT substrate 200 according to a comparative example. In the TFT substrate 200 of the comparative example, a storage capacitor CS is coupled to a switching transistor TR2 through a metal layer 170 and to a driving transistor TR1 through a source wiring line 147. In other words, the storage capacitor CS is provided separately from the driving transistor TR1 and the switching transistor TR2. This makes it difficult to maintain a storage capacitance while improving definition.

In contrast, according to an example embodiment of the technology, the CS lower electrode 121 and the semiconductor auxiliary layer 123 that is in contact with the source region 132 may be opposed to each other across the CS insulating film 122, and the CS lower electrode 121 and the semiconductor auxiliary layer 123 may serve as the storage capacitor CS1. In other words, in the example embodiment of the technology, a portion of the switching transistor TR2 may also serve as a portion of the storage capacitor CS1. Accordingly, it is possible to maintain a storage capacitance while improving definition, compared with a case where the storage capacitor CS1 is provided separately.

According to an example embodiment of the technology, the laminate that includes the CS lower electrode 121, the CS insulating film 122, and the semiconductor auxiliary layer 123 that are stacked in this order from the base 110 may serve as the storage capacitor CS1. Accordingly, it is possible to maintain a storage capacitance while improving definition, compared with a case where the storage capacitor CS1 is provided separately.

According to an example embodiment of the technology, the source region 132 and the CS upper electrode 126 that are opposed to each other across the CS insulating film 125 may serve as the storage capacitor CS2. Accordingly, it is possible to maintain a storage capacitance while improving definition, compared with a case where the storage capacitor CS2 is provided separately.

According to an example embodiment of the technology, the laminate that includes the source region 132, the CS insulating film 125, and the CS upper electrode 126 that are stacked in this order from the base 110 may serve as the storage capacitor CS2. Accordingly, it is possible to maintain a storage capacitance while improving definition, compared a case where the storage capacitor CS2 is provided separately.

According to an embodiment of the technology, the storage capacitor CS2 may be provided on the storage capacitor CS1. Accordingly, it is possible to maintain a storage capacitance while improving definition, compared with a case where the storage capacitor CS1 and the storage capacitor CS2 are placed horizontally to each other.

Application Example 1: Display Unit and Imaging Unit

The semiconductor device 1 and the TFT substrate 53 that are described in the first and second embodiments described above may be applied to driving circuits of a display unit, such as a display unit 2A illustrated in FIG. 16 described below, and an imaging unit, such as an imaging unit 2B illustrated in FIG. 17 described below.

Figure 16:
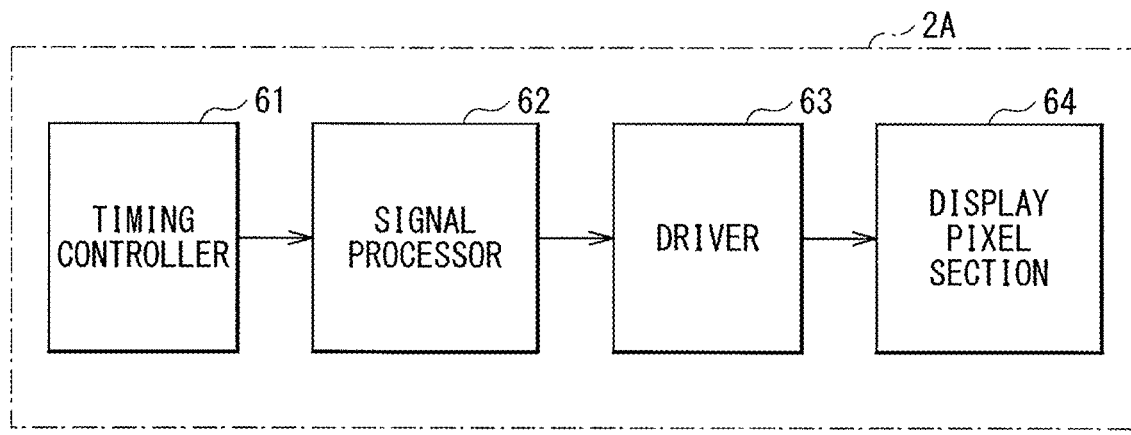
FIG. 16 is an example block diagram of a display unit to which the semiconductor device of FIG. 1 is applied.

FIG. 16 is a block diagram of the display unit 2A. The display unit 2A may display an external or internal image signal in the form of an image. The display unit 2A may be applied to, for example, a liquid crystal display as well as the organic EL display described above. The display unit 2A may include, for example, a timing controller 61, a signal processor 62, a driver 63, and a display pixel section 64.

The timing controller 61 may include a timing generator that generates various timing signals or control signals. The timing controller 61 may control driving of the signal processor 62 on the basis of the various timing signals, for example. The signal processor 62 may perform a predetermined correction of an external digital image signal, for example, and may output the corrected image signal to the driver 63. The driver 63 may include, for example, a scanning-line driving circuit and a signal-line driving circuit, and may drive pixels in the display pixel section 64 via various control lines. The display pixel section 64 may include, for example, a display element, such as an organic electroluminescent element or a liquid crystal display element, and a pixel circuit that drives the display element on a pixel basis. The semiconductor device 1 and the TFT substrate 53 may be used in any circuit serving as a portion of the driver 63 or a portion of the display pixel section 64, for example.

Figure 17:
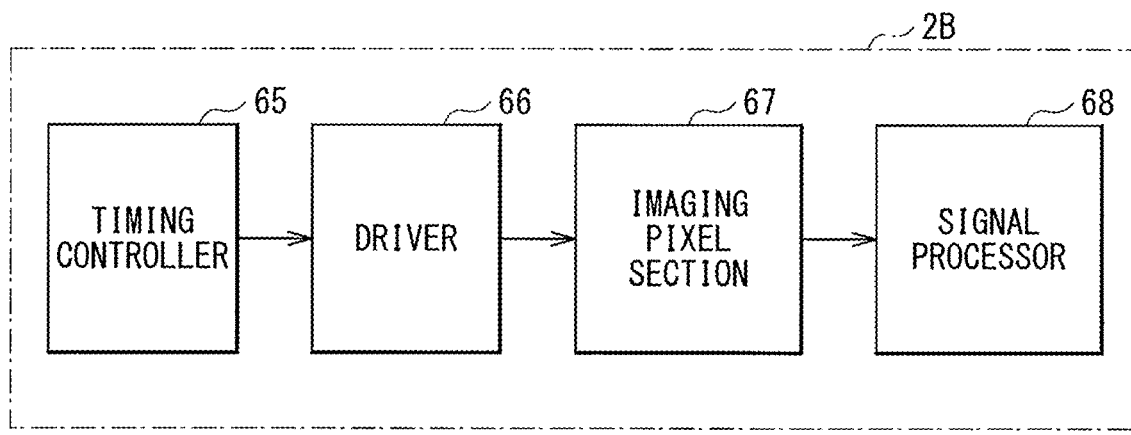
FIG. 17 is an example block diagram of an imaging unit to which the semiconductor device 1 of FIG. 1 is applied.

FIG. 17 is a block diagram of the imaging unit 2B. The imaging unit 2B may be a solid imaging unit that acquires an image as an electric signal, for example. The imaging unit 2B may include, for example, a charge coupled device (CCD) or a complementary metal oxide semiconductor (CMOS) image sensor. The imaging unit 2B may include, for example, a timing controller 65, a driver 66, an imaging pixel section 67, and a signal processor 68.

The timing controller 65 may include a timing generator that generates various timing signals or control signals. The timing controller 65 may control driving of the driver 66 on the basis of the various timing signals. The driver 66 may include a row selection circuit, an AD converter circuit, and a horizontal transfer scanning circuit, for example. The driver 66 may read a signal from each pixel in the imaging pixel section 67 through various control lines. The imaging pixel section 67 may include, for example, an imaging element, such as a photoelectric transducer or a photodiode, and a pixel circuit that reads signals. The signal processor 68 may perform various processes of the signals received from the imaging pixel section 67. The semiconductor device 1 or the TFT substrate 53 that are described above may be used in various circuits that serve as a portion of the driver 66 or the imaging pixel section 67.

Application Example 2: Electronic Apparatus

Figure 18:
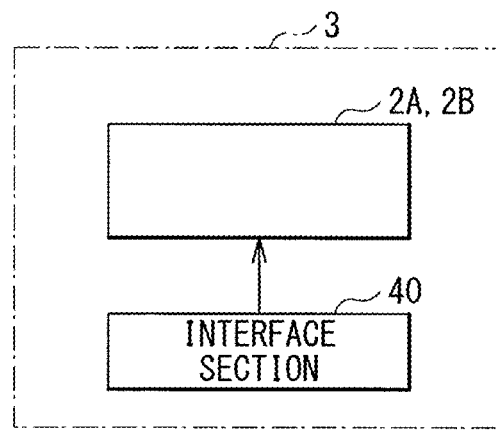
FIG. 18 is an example block diagram of an electronic apparatus according to one embodiment of the technology.

The display unit 2A and the imaging unit 2B may be applied to a variety of electronic apparatuses. FIG. 18 is a block diagram of an electronic apparatus 3. Specific but non-limiting examples of the electronic apparatus 3 may include television apparatuses, personal computers (PCs), smartphones, tablet PCs, mobile phones, digital still cameras, and digital video cameras.

The electronic apparatus 3 may include, for example, the display unit 2A or the imaging unit 2B described above, and an interface section 40. The interface section 40 may be an input section that receives various external signals and electric power. The interface section 40 may include a user interface, such as a touch panel, a keyboard, and operational buttons.

Although the technology is described with reference to the example embodiments and application examples hereinabove, these example embodiments and application examples are not to be construed as limiting the scope of the technology and may be modified in a wide variety of ways. For example, the materials and thicknesses of the layers described in the example embodiments should not be limited to those described above, and may be different from those described above.

In the example embodiments and application examples described above, the contact 10 may couple the transistor Tr and the storage capacitor Cs; however, the contact 10 may be used to couple other elements.

In the example embodiments and application examples described above, the semiconductor auxiliary layer 22 may be in contact with the lower surface of the semiconductor film 15. Alternatively, the semiconductor auxiliary layer 22 may be in contact with the upper surface of the semiconductor film 15.

It should be appreciated that the effects described herein are mere examples. Effects of the example embodiment of the technology are not limited to those described herein, and may be different from those described herein. The technology may further include any effects other than those described herein.

It is possible to achieve at least the following configurations from the foregoing example embodiments of the technology.

(1) A semiconductor device including:
   a base having a first region, a second region, and a third region, the first region, the second region, and the third region being provided in this order along a predetermined direction and adjacent to each other;
   a first wiring line provided in the first region, the second region, and the third region of the base;
   a semiconductor film having one or more low-resistance regions, being provided between the first wiring line and the base in the first region, and being in contact with the first wiring line in the second region;
   a second wiring line provided closer to the base than the semiconductor film is, and being in contact with the first wiring line in the third region;
   an insulating film provided between the first wiring line and the semiconductor film in the first region; and
   a semiconductor auxiliary layer provided in contact with the semiconductor film at least in the first region, and assisting electrical coupling that is via the first region.

(2) The semiconductor device according to (1), in which the semiconductor auxiliary layer supplies carriers to the semiconductor film.

(3) The semiconductor device according to (1), in which the semiconductor auxiliary layer has electrical conductivity.

(4) The semiconductor device according to any one of (1) to (3), in which the semiconductor auxiliary layer includes metal or an oxide semiconductor.

(5) The semiconductor device according to any one of (1) to (4), in which the semiconductor auxiliary layer is provided between the semiconductor film and the base.

(6) The semiconductor device according to any one of (1) to (5), further including a transistor, in which the semiconductor film includes a channel region of the transistor.

(7) The semiconductor device according to (6), in which the transistor includes the semiconductor film, a gate insulating film, and a gate electrode, in this order on the base.

(8) The semiconductor device according to (7), in which
   the gate insulating film includes a material same as a material of the insulating film and has a thickness same as a thickness of the insulating film, and
   the gate electrode includes a material same as a material of the first wiring line and has a thickness same as a thickness of the first wiring line.

(9) The semiconductor device according to any one of (1) to (8), further including a storage capacitor, in which the second wiring line serves as one of electrodes of the storage capacitor.

(10) The semiconductor device according to any one of (1) to (9), in which the semiconductor film includes an oxide semiconductor material.

(11) The semiconductor device according to any one of (1) to (10), in which the one or more low-resistance regions of the semiconductor film are adjacent to the first region.

(12) The semiconductor device according to any one of (1) to (11), in which the second wiring line extends to the second region and the first region, and the semiconductor auxiliary layer has a region opposed to the second wiring line across the insulating film.

(13) A display unit including a display element and a semiconductor device configured to drive the display element, the semiconductor device including:
   a base having a first region, a second region, and a third region, the first region, the second region, and the third region being provided in this order along a predetermined direction and adjacent to each other;
   a first wiring line provided in the first region, the second region, and the third region of the base;
   a semiconductor film having one or more low-resistance regions, being provided between the first wiring line and the base in the first region, and being in contact with the first wiring line in the second region;
   a second wiring line provided closer to the base than the semiconductor film is, and being in contact with the first wiring line in the third region;
   an insulating film provided between the first wiring line and the semiconductor film in the first region; and
   a semiconductor auxiliary layer provided in contact with the semiconductor film at least in the first region, and assisting electrical coupling that is via the first region.

(14) A semiconductor substrate including:
   a first transistor configured to control an electric current flowing in a self-luminescent element;
   a second transistor configured to control a voltage to be applied to a gate of the first transistor; and
   a storage capacitor configured to hold a voltage between the gate and a source of the first transistor,
   the second transistor including
      an oxide semiconductor layer having a channel region and a low-resistance region, the low-resistance region being electrically coupled to the gate of the first transistor and having a resistance lower than a resistance of the channel region, and
      a semiconductor auxiliary layer provided in contact with the low-resistance region, and assisting electrical coupling that is via the low-resistance region,
   the storage capacitor including a first metal layer opposed to the semiconductor auxiliary layer across a first insulating layer, the first metal layer and the semiconductor auxiliary layer that are opposed to each other across the first insulating layer serving as a first capacitor.

(15) The semiconductor substrate according to (14), further including a base that supports each of the first transistor, the second transistor, and the storage capacitor, in which the storage capacitor includes a first laminate that includes the first metal layer, the first insulating layer, and the semiconductor auxiliary layer that are stacked in this order from the base, the first laminate serving as the first capacitor.

(16) The semiconductor substrate according to (15), in which the storage capacitor further includes a second metal layer that couples the first metal layer and the gate of the first transistor to each other, and the low-resistance region and the second metal layer that are opposed to each other across a second insulating layer serve a second capacitor.

(17) The semiconductor substrate according to (16), in which the storage capacitor includes a second laminate that includes the low-resistance region, the second insulating layer, and the second metal layer that are stacked in this order from the base, the second laminate serving as the second capacitor.

(18) The semiconductor substrate according to (17), in which the second laminate is provided on the first laminate.

(19) The semiconductor substrate according to any one of (14) to (18), in which the semiconductor auxiliary layer includes metal or an oxide semiconductor.

(20) A luminescent unit including:
a semiconductor substrate;
a light-emitting panel provided on the semiconductor substrate, the light-emitting panel including a plurality of pixels each having a self-luminescent element; and
a driving circuit configured to drive the light-emitting panel, the semiconductor substrate including, for each of the pixels,
a first transistor configured to control an electric current flowing in a self-luminescent element,
a second transistor configured to control a voltage to be applied to a gate of the first transistor, and
a storage capacitor configured to hold a voltage between the gate and a source of the first transistor,
the second transistor including
an oxide semiconductor layer having a channel region and a low-resistance region, the low-resistance region being electrically coupled to a gate of the first transistor and having a resistance lower than a resistance of the channel region, and
a semiconductor auxiliary layer provided in contact with the low-resistance region, the semiconductor auxiliary layer assisting electrical coupling via the low-resistance region,
the storage capacitor including a first metal layer opposed to the semiconductor auxiliary layer across a first insulating layer, the first metal layer and the semiconductor auxiliary layer that are opposed to each other across the first insulating layer serving as a first capacitor.

In the semiconductor device and the display unit according to an example embodiment of the technology, electrical contact between the semiconductor film and the second wiring line may be established through the first wiring line in the second region and the third region. In this example embodiment, the semiconductor auxiliary layer is provided in contact with the semiconductor film in the first region. This maintains the electrical coupling via the first region even if the diffusion or infiltration of the carriers from the low-resistance region of the semiconductor film to the first region is insufficient.

In the semiconductor substrate and the luminescent unit according to an example embodiment of the technology, the metal layer and the semiconductor auxiliary layer that is in contact with the low-resistance region are opposed to each other across the insulating layer, and the metal layer and the semiconductor auxiliary layer together serve as the capacitor. In other words, a portion of the second transistor may also serve as a portion of the storage capacitor in the example embodiment of the technology. Accordingly, it is possible to maintain a storage capacitance while improving definition, compared with a case where a storage capacitor is provided separately.

In the semiconductor device and the display unit according to an example embodiment of the technology, the semiconductor auxiliary layer is provided in contact with the semiconductor film in the first region. Accordingly, it is possible to stably maintain the electrical coupling via the first region, which enhances contact stability. Additionally, in the semiconductor substrate and the luminescent unit according to an example embodiment of the technology, the metal layer and the semiconductor auxiliary layer that is in contact with the low-resistance region are opposed to each other across the insulating layer, and the metal layer and the semiconductor auxiliary layer together serve as the capacitor. Accordingly, it is possible to maintain a storage capacitance while improving definition. It is to be noted that effects of the example embodiments and application examples of the technology should not be limited to those described hereinabove, and may be any effect described herein.

Although the technology is described hereinabove in terms of example embodiments, it is not limited thereto. It should be appreciated that variations may be made in the described example embodiments by persons skilled in the art without departing from the scope of the technology as defined by the following claims. The limitations in the claims are to be interpreted broadly based on the language employed in the claims and not limited to examples described in this specification or during the prosecution of the application, and the examples are to be construed as non-exclusive. For example, in this technology, the use of the terms first, second, etc. do not denote any order or importance, but rather the terms first, second, etc. are used to distinguish one element from another. The term "disposed on/provided on/formed on" and its variants as used herein refer to elements disposed directly in contact with each other or indirectly by having intervening structures therebetween. Moreover, no element or component in this technology is intended to be dedicated to the public regardless of whether the element or component is explicitly recited in the following claims.

What is claimed is:
1. A semiconductor substrate comprising:
a first transistor configured to control an electric current flowing in a self-luminescent element;
a second transistor configured to control a voltage to be applied to a gate of the first transistor; and
a storage capacitor configured to hold a voltage between the gate and a source of the first transistor,
the second transistor including
an oxide semiconductor layer having a channel region and a low-resistance region, the low-resistance region being directly electrically coupled to the gate of the first transistor and having a resistance lower than a resistance of the channel region, and
a semiconductor auxiliary layer provided in contact with the low-resistance region, and assisting electrical coupling that is via the low-resistance region,
the storage capacitor including a first metal layer opposed to the semiconductor auxiliary layer across a first insulating layer, the first metal layer and the semiconductor auxiliary layer that are opposed to each other across the first insulating layer serving as a first capacitor.

2. The semiconductor substrate according to claim 1, further comprising a base that supports each of the first transistor, the second transistor, and the storage capacitor,
wherein the storage capacitor includes a first laminate that includes the first metal layer, the first insulating layer, and the semiconductor auxiliary layer that are stacked in this order from the base, the first laminate serving as the first capacitor.

3. The semiconductor substrate according to claim 2, wherein
the storage capacitor further comprises a second metal layer that couples the first metal layer and the gate of the first transistor to each other, and
the low-resistance region and the second metal layer that are opposed to each other across a second insulating layer serve a second capacitor.

4. The semiconductor substrate according to claim 3, wherein the storage capacitor includes a second laminate that includes the low-resistance region, the second insulating layer, and the second metal layer that are stacked in this order from the base, the second laminate serving as the second capacitor.

5. The semiconductor substrate according to claim 4, wherein the second laminate is provided on the first laminate.

6. The semiconductor substrate according to claim 1, wherein the semiconductor auxiliary layer includes metal or an oxide semiconductor.

7. A luminescent unit comprising:
the semiconductor substrate according to claim 1;
a light-emitting panel provided on the semiconductor substrate, the light-emitting panel including a plurality of pixels each having a self-luminescent element; and
a driving circuit configured to drive the light-emitting panel,
the semiconductor substrate including the first transistor, the second transistor, and the storage capacitor for each of the pixels.

8. A semiconductor substrate comprising:
a first transistor configured to control an electric current flowing in a self-luminescent element;
a second transistor configured to control a voltage to be applied to a gate of the first transistor; and
a storage capacitor configured to hold a voltage between the gate and a source of the first transistor, wherein the storage capacitor is separated from the first transistor,
the second transistor including
an oxide semiconductor layer having a channel region and a low-resistance region, the low-resistance region being electrically coupled to the gate of the first transistor and having a resistance lower than a resistance of the channel region, and
a semiconductor auxiliary layer provided in contact with the low-resistance region, and assisting electrical coupling that is via the low-resistance region,
the storage capacitor including a first metal layer opposed to the semiconductor auxiliary layer across a first insulating layer, the first metal layer and the semiconductor auxiliary layer that are opposed to each other across the first insulating layer serving as a first capacitor.

9. The semiconductor substrate according to claim 8, further comprising a base that supports each of the first transistor, the second transistor, and the storage capacitor,
wherein the storage capacitor includes a first laminate that includes the first metal layer, the first insulating layer, and the semiconductor auxiliary layer that are stacked in this order from the base, the first laminate serving as the first capacitor.

10. The semiconductor substrate according to claim 9, wherein
the storage capacitor further comprises a second metal layer that couples the first metal layer and the gate of the first transistor to each other, and
the low-resistance region and the second metal layer that are opposed to each other across a second insulating layer serve a second capacitor.

11. The semiconductor substrate according to claim 10, wherein the storage capacitor includes a second laminate that includes the low-resistance region, the second insulating layer, and the second metal layer that are stacked in this order from the base, the second laminate serving as the second capacitor.

12. The semiconductor substrate according to claim 11, wherein the second laminate is provided on the first laminate.

13. The semiconductor substrate according to claim 8, wherein the semiconductor auxiliary layer includes metal or an oxide semiconductor.

14. A luminescent unit comprising:
the semiconductor substrate according to claim 8;
a light-emitting panel provided on the semiconductor substrate, the light-emitting panel including a plurality of pixels each having a self-luminescent element; and
a driving circuit configured to drive the light-emitting panel,
the semiconductor substrate including the first transistor, the second transistor, and the storage capacitor for each of the pixels.

15. A semiconductor substrate comprising:
a first transistor configured to control an electric current flowing in a self-luminescent element;
a second transistor configured to control a voltage to be applied to a gate of the first transistor; and
a storage capacitor configured to hold a voltage between the gate and a source of the first transistor, wherein the storage capacitor is separated from the first transistor,
the second transistor including
an oxide semiconductor layer having a channel region and a low-resistance region, the low-resistance region being directly electrically coupled to the gate of the first transistor and having a resistance lower than a resistance of the channel region, and
a semiconductor auxiliary layer provided in contact with the low-resistance region, and assisting electrical coupling that is via the low-resistance region,
the storage capacitor including a first metal layer opposed to the semiconductor auxiliary layer across a first insulating layer, the first metal layer and the semiconductor auxiliary layer that are opposed to each other across the first insulating layer serving as a first capacitor.

* * * * *